(12) United States Patent
Campbell et al.

(10) Patent No.: US 10,032,950 B2
(45) Date of Patent: Jul. 24, 2018

(54) ALLNASSB AVALANCHE PHOTODIODE AND RELATED METHOD THEREOF

(71) Applicant: University of Virginia Patent Foundation, Charlottesville, VA (US)

(72) Inventors: Joe C. Campbell, Charlottesville, VA (US); Min Ren, Charlottesville, VA (US); Madison Woodson, Virginia Beach, VA (US); Yaojia Chen, Jersey City, NJ (US); Seth Bank, Austin, TX (US); Scott Maddox, Austin, TX (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 15/438,870

(22) Filed: Feb. 22, 2017

(65) Prior Publication Data

US 2017/0244002 A1     Aug. 24, 2017

Related U.S. Application Data

(60) Provisional application No. 62/461,305, filed on Feb. 21, 2017, provisional application No. 62/298,327, filed on Feb. 22, 2016.

(51) Int. Cl.
  *H01L 31/107*  (2006.01)
  *H01L 31/0304*  (2006.01)
  *H01L 21/02*  (2006.01)

(52) U.S. Cl.
  CPC .... *H01L 31/1075* (2013.01); *H01L 21/02549* (2013.01); *H01L 31/03046* (2013.01)

(58) Field of Classification Search
  CPC ............... H01L 31/107; H01L 31/1075; H01L 31/03046; H01L 21/02398; H01L 21/02466; H01L 21/02549
  See application file for complete search history.

(56) References Cited

U.S. PATENT DOCUMENTS

| | | | |
|---|---|---|---|
| 4,473,835 A | 9/1984 | Forrest et al. | |
| 4,631,566 A | 12/1986 | Campbell et al. | |
| 4,751,555 A | 6/1988 | Alferness et al. | |
| 4,857,982 A | 8/1989 | Forrest | |
| 4,876,209 A | 10/1989 | Forrest | |
| 4,935,795 A * | 6/1990 | Mikawa | H01L 31/1075 257/437 |

(Continued)

FOREIGN PATENT DOCUMENTS

GB     2273771 B     10/1995

OTHER PUBLICATIONS

Beling, A., et al., "Advances in Photodetectors and Optical Receivers", Optical Fiber Telecommunications VIA, 2013, pp. 99-154, 6th Edition, Chapter 3.

(Continued)

*Primary Examiner* — Jesse Y Miyoshi
*Assistant Examiner* — John Lin
(74) *Attorney, Agent, or Firm* — Robert J. Decker

(57) ABSTRACT

An avalanche photodiode, and related method of manufacture and method of use thereof, that includes a first contact layer; a multiplication layer, wherein the multiplication layer includes AlInAsSb; a charge, wherein the charge layer includes AlInAsSb; an absorption, wherein the absorption layer includes AlInAsSb; a blocking layer; and a second contact layer.

24 Claims, 12 Drawing Sheets

(56) References Cited

U.S. PATENT DOCUMENTS

| | | | |
|---|---|---|---|
| 5,121,181 | A | 6/1992 | Smith, III et al. |
| 5,539,221 | A | 7/1996 | Tsuji et al. |
| 5,596,211 | A | 1/1997 | Onda et al. |
| 5,783,838 | A | 7/1998 | Kyozuka et al. |
| 5,937,274 | A * | 8/1999 | Kondow ............... B82Y 20/00 |
| | | | 257/186 |
| 5,985,689 | A | 11/1999 | Gofuku et al. |
| 6,229,152 | B1 | 5/2001 | Dries et al. |
| 6,252,287 | B1 | 6/2001 | Kurtz et al. |
| 6,963,089 | B2 | 11/2005 | Shi et al. |
| 7,045,833 | B2 | 5/2006 | Campbell et al. |
| 7,161,170 | B1 | 1/2007 | Yoder |
| 7,276,770 | B1 | 10/2007 | Goushcha et al. |
| 7,880,197 | B2 | 2/2011 | Ishibashi et al. |
| 9,748,430 | B2 | 8/2017 | Bank et al. |
| 2003/0047752 | A1 | 3/2003 | Campbell et al. |
| 2005/0029541 | A1 | 2/2005 | Ko |
| 2007/0131977 | A1 * | 6/2007 | Boisvert ........... H01L 27/14607 |
| | | | 257/233 |
| 2010/0133637 | A1 | 6/2010 | Yagyu et al. |
| 2010/0163925 | A1 | 7/2010 | Ishibashi et al. |
| 2011/0291158 | A1 * | 12/2011 | Ogura ................. H01L 31/1105 |
| | | | 257/187 |
| 2012/0299141 | A1 | 11/2012 | Sasahata et al. |
| 2014/0291682 | A1 | 10/2014 | Huang et al. |
| 2015/0115319 | A1 | 4/2015 | Levine |
| 2016/0372623 | A1 | 12/2016 | Bank et al. |

OTHER PUBLICATIONS

Campbell, J.C., "Advances in photodetectors", Optical Fiber Telecommunications V A: Components and Subsystems, 5th Edition, 2008, pp. 221-268, Academic Press.

Campbell, J.C., "Recent Advances in Avalanche Photodiodes", Journal of Lightwave Technology, Jan. 15, 2016, pp. 278-285, vol. 34, No. 2.

Campbell, J.C., et al., "High-Performance Avalanche Photodiode with Separate Absorption 'Grading' and Multiplication Regions", Electronics Letters, 1983, pp. 818-820, vol. 19, Iss. 20.

Duan, N., et al., "310 GHz gain-bandwidth product Ge/Si avalanche photodetector for 1550 nm light detection", Optics Express, May 7, 2012, pp. 11031-11036, vol. 20, No. 10.

Emmons, R.B., "Avalanche-Photodiode Frequency Response", Journal of Applied Physics, Aug. 1967, pp. 3705-3714, vol. 38, No. 9.

Fujisawa, T., et al., "1.3-µm, 4×25-Gbit/s, EADFB laser array module with large-output-power and low-driving-voltage for energy-efficient 100GbE transmitter", Optics Express, Jan. 2, 2012, pp. 614-620, vol. 20, No. 1.

Hasnain, G., et al., "Buried-Mesa Avalanche Photodiodes", IEEE Journal of Quantum Electronics, Dec. 1998, pp. 2321-2326, vol. 34, No. 12.

Hirota, Y., et al., "High-Speed Avalanche Photodiode with a Neutral Absorption Layer for 1.55 µm Wavelength", Japanese Journal of Applied Physics, 2004, pp. L375-L377, vol. 43, Part 2, No. 3A.

Hirota, Y., et al., "Reliable non-Zn-diffused InP/InGaAs avalanche photodiode with buried n-InP layer operated by electron injection mode", Electronics Letters, Oct. 14, 2004, 2 pages, vol. 40, No. 21.

Huang, M., et al., "Development of Si photonics technology: Ge/Si avalanche photodiode for PON applications", Optical Fiber Communication Conference, OSA Technical Digest (online) (Optical Society of America), 2014, pp. 1-3, Tu2C.2.

Itzler, M.A., et al., "Manufacturable Planar Bulk-InP Avalanche Photodiodes for 10 Gb/s Applications", LEOS '99, IEEE Lasers and Electro-Optics Society 12th Annual Meeting, 1999, pp. 748-749, vol. 2, San Francisco, USA.

Kang, Y., et al., "High Performance Ge/Si Avalanche Photodiodes Development in Intel", 2011 Optical Fiber Communication Conference and Exposition and the National Fiber Optic Engineers Conference, Mar. 6-10, 2011, 3 pages, OWZ1.

Kang, Y., et al., "Monolithic germanium/silicon avalanche photodiodes with 340 GHz gain-bandwidth product", Nature Photonics, published online Dec. 7, 2008 (Doi: 10.1038/NPHOTON.2008.247), pp. 59-63, vol. 3.

Keldysh, L.V., "Kinetic Theory of Impact Ionization in Semiconductors", Soviet Physics JETP, Mar. 1960, pp. 509-518, vol. 37 (10), No. 3.

Law et al., "III-V Alloy Heterostructure High Speed Avalanche Photodiodes", IEEE Journal of Quantum Electronics, Jul. 1979, pp. 549-558, vol. QE-15, No. 7.

Law, H.D., et al., "1.0-1.4-µm High Speed Avalanche Photodiodes", Applied Physics Letters, Sep. 1, 1978, pp. 116-417, vol. 33, No. 5.

Lenox, C., et al., "Thin multiplication region InAlAs homojunction avalanche photodiodes", Applied Physics Letters, Aug. 10, 1998, pp. 783-784, vol. 73, No. 6.

Liu, H., et al., "Avalanche photodiode punch-through gain determination through excess noise analysis", Journal of Applied Physics, 2009, pp. 064507-1-064507-4, vol. 106.

Ma, F., et al., "Monte Carlo simulation of low-noise avalanche photodiodes with heterojunctions", Journal of Applied Physics, Oct. 15, 2002, pp. 4791-4795, vol. 92, No. 8.

Maddox, S.J., et al., "Broadly Tunable AlInAsSb Digital Alloys Grown on GaSb", Crystal Growth & Design, 2016, pp. 3582-3586, vol. 16, No. 7.

Matsushima, Y., et al., "High Speed-Response InGaAs/InP Heterostructure Avalanche Photodiode with InGaAsP Buffer Layers", Electronics Letters, Oct. 28, 1982, pp. 945-946, vol. 18, No. 22.

McIntyre, R.J., "Multiplication Noise in Uniform Avalanche Diodes", IEEE Transactions on Electron Devices, Jan. 1966, pp. 164-168, vol. ED-13, No. 1.

Nada, M., et al., "Triple-mesa Avalanche Photodiode With Inverted P-Down Structure for Reliability and Stability", Journal of Lightwave Technology, Apr. 15, 2014, pp. 1543-1548, vol. 32, No. 8.

Park, C.Y., et al., "High-performance InGaAs/InP avalanche photodiode for a 2.5 Gb s-1 optical receiver", Optical and Quantum Electronics, 1995, pp. 553-559, vol. 27, Iss. 5.

Ren, M., et al., "AlInAsSb separate absorption, charge, and multiplication avalanche photodiodes", Applied Physics Letters, 2016, pp. 191108-1-191108-4, vol. 108.

Ren, M., et al., "AlInAsSb/GaSb staircase avalanche avalanche photodiode", Applied Physics Letters, 2016, pp. 381101-1-081101-4, vol. 108.

Robbins, V.M., et al., "Electron and hole impact ionization coefficients in (100) and in (111) Si", Journal of Applied Physics, Dec. 15, 1985, pp. 4614-4617, vol. 58, No. 12.

Sun, W., et al., "High-Gain InAs Avalanche Photodiodes", IEEE Journal of Quantum Electronics, Feb. 2013, pp. 154-161, vol. 49, No. 2.

Vaughn, L.G., et al., "Type I Mid-Infrared MQW Lasers Using AlInAsSb Barriers and InAsSb Wells", Proceedings of SPIE, 2005, pp. 307-318, vol. 5722.

Webb, P.P. et al., "Properties of Avalanche Photodiodes", RCA Review, Jun. 1974, pp. 234-278, vol. 35, No. 2.

Woodson, Me., et al., "Low-noise AlInAsSb avalanche photodiode", Applied Physics Letters, 2016, pp. 081102-1-381102-4, vol. 108.

* cited by examiner

ALLNASSB AVALANCHE PHOTODIODE AND RELATED METHOD THEREOF

RELATED APPLICATIONS

The present application claims benefit of priority under 35 U.S.C § 119 (e) from U.S. Provisional Application Ser. No. 62/298,327, filed Feb. 22, 2016, entitled "AlInAsSb Avalanche Photodiode and Related Method thereof" and U.S. Provisional Application Ser. No. 62/461,305, filed Feb. 21, 2017, entitled "AlInAsSb Avalanche Photodiode and Related Method thereof"; the disclosures of which are hereby incorporated by reference herein in their entirety.

STATEMENT OF GOVERNMENT INTEREST

This invention was made with government support under Grant Nos. W911NF-10-1-0391 and W911NF-12-1-0428 awarded by the Army Research Office. The government has certain rights in the invention.

FIELD OF THE INVENTION

The present invention relates generally to avalanche photodiodes, and more particularly to an avalanche photodiode with a multiplication region, charge region and an absorption region composed of an aluminum indium arsenide antimonide (AlInAsSb) alloy.

BACKGROUND

Until the early 2000's avalanche photodiodes (APDs) were widely deployed in 10 Gb/s optical receivers. In subsequent years, the use of APDs for high-capacity systems declined as a result of their limited gain-bandwidth, the transition to coherent detection, and the development of high efficiency modulation techniques. Recently, the rapid growth of optical-fiber communications systems that utilize baud rates up to 25 Gbit/s as represented by 100-Gbit/s Ethernet (100 GbE) has led to a resurgence of research on APDs. Two figures of merit for APD optical receivers are the excess noise factor and the gain-bandwidth product. Both are linked to the k factor, which is the ratio of the electron, $\alpha$, and hole, $\beta$, ionization coefficients. The mean-squared shot-noise current can be expressed as the equation:

$$\langle i_{shot}^2 \rangle = 2q(I_{ph} + I_{dark})M^2 F(M)\Delta f \quad (1)$$

where $I_{ph}$ and $I_{dark}$ are the primary photocurrent and dark current, respectively, M is the avalanche gain, $\Delta f$ is the bandwidth, and F(M) is the excess noise factor. In the local field model the excess noise factor is given by the equation:

$$F(M) = kM + (1-k)(2 - 1/M). \quad (2)$$

The excess noise factor increases with increasing gain but increases more slowly for lower values of k. The present inventors point out that higher receiver sensitivities are achieved with low k values. The gain-bandwidth product is important because it is essential that the APD operate at sufficiently high gain to overcome the noise limitation of the following amplifier at the transmission bit rate. The present inventors point out that the lower the k value, the higher the gain bandwidth product of an APD. Initially, for bit rates ≤10 Gb/s, InP/InGaAs APDs were the photodetectors that achieved the highest receiver sensitivities. However, the relatively high k value of InP, k~0.5, resulted in high excess noise and gain-bandwidth products of <100 GHz. Recently, AlInAs/InGaAs APDs, for which the k value is ~0.2; these APDs achieved 235 GHz gain-bandwidth product and receiver sensitivity of −21 dBm at 25 Gb/s and $10^{-12}$ bit error rate. However, the "champion" material candidate for high performance APDs is Si. It has demonstrated k values ~0.02 and gain-bandwidth products >340 GHz. Unfortunately, as the present inventors point out, the bandgap of Si obviates operation at wavelengths >1.0 μm. There have been many efforts in the past 20 years to achieve the low noise and high gain-bandwidth product of Si at telecommunications wavelengths (1.3 μm to 1.6 μm). One approach to utilize the excellent gain characteristics of Si has been to combine a Ge absorption region with a Si multiplication layer in a separate absorption, charge, and multiplication (SACM) APD. In optical receivers, these APDs have achieved sensitivities as high as those of the best III-V compound APDs but not superior, as would have been expected from their low k value. This sensitivity limitation stems from the high dark current, that arises from the lattice mismatch between Ge and Si, which contributes enough to the noise to offset the lower excess noise factor.

In light of the above, a need arises APDs with optimal k values and excellent gain/noise characteristics similar to that of Si with the low dark current and high speed of the III-V compound APDs.

Overview

An aspect of an aspect of an embodiment of the present invention provides, among other things, an avalanche photodiode that may comprise: a first contact layer; a multiplication layer adjacent to the first contact layer, wherein the multiplication layer comprises AlInAsSb; a charge layer adjacent to the multiplication layer opposite the first contact layer, wherein the charge layer comprises AlInAsSb; an absorption layer adjacent to the charge layer, opposite the multiplication layer, wherein the absorption layer comprises AlInAsSb; a blocking layer adjacent to the absorption layer, opposite the charge layer; and second contact layer adjacent the blocking layer, opposite the absorption layer.

An aspect of an aspect of an embodiment of the present invention provides, among other things, an avalanche photodiode, and related method of manufacture and method of use thereof, that includes a first contact layer; a multiplication layer, wherein said multiplication layer comprises AlInAsSb; a charge, wherein said charge layer comprises AlInAsSb; an absorption, wherein said absorption layer comprises AlInAsSb; a blocking layer; and second contact layer.

An aspect of an aspect of an embodiment of the present invention provides, among other things, an avalanche photodiodes (and related method of manufacture and use) with a multiplication region, charge region and an absorption region composed of an aluminum indium arsenide antimonide (AlInAsSb) alloy.

An aspect of an embodiment of the present invention provides, among other things, SACM avalanche photodiodes fabricated from $Al_xIn_{1-x}As_ySb_{1-y}$, grown on GaSb. The excess noise factor of the $Al_xIn_{1-x}As_ySb_{1-y}$ SACM APDs multiplication is characterized by a k value of 0.01 and gain as high as 50 has been achieved. Further, the lattice-matched $Al_xIn_{1-x}As_ySb_{1-y}$, absorbing region extends the operating wavelength to the short-wavelength infrared (SWIR) spectrum. These APDs combine the excellent gain/noise characteristics of Si with the low dark current and high speed of the III-V compound APDs.

An aspect of an embodiment of the present invention provides, among other things, an avalanche photodiode, fabricated from $Al_xIn_{1-x}As_ySb_{1-y}$, with low excess noise corresponding to k=0.015 and peak quantum efficiency.

Furthermore, since $Al_xIn_{1-x}As_ySb_{1-y}$ has a direct bandgap, it provides higher bandwidths than Si, which is typically limited by transit times. An aspect of an embodiment of the new materials system provides, but not limited thereto, an innovative alternative to Si for detection across the visible and near-infrared wavelengths.

These and other objects, along with advantages and features of various aspects of embodiments of the invention disclosed herein, will be made more apparent from the description, drawings and claims that follow.

BRIEF DESCRIPTION OF THE DRAWINGS

The foregoing and other objects, features and advantages of the present invention, as well as the invention itself, will be more fully understood from the following description of preferred embodiments, when read together with the accompanying drawings.

The accompanying drawings, which are incorporated into and form a part of the instant specification, illustrate several aspects and embodiments of the present invention and, together with the description herein, serve to explain the principles of the invention. The drawings are provided only for the purpose of illustrating select embodiments of the invention and are not to be construed as limiting the invention.

FIG. 5 (B) graphically illustrates measured capacitance and calculated depletion width versus bias of a typical 50-μm-diameter $Al_xIn_{1-x}As_ySb_{1-y}$ SACM APD at 300 k. The significant change of capacitance and depletion width at approximately −38 V indicates electric field has depleted the charge layer and entered into absorption layer.

DETAILED DESCRIPTION OF EXEMPLARY EMBODIMENTS

Figure 1:
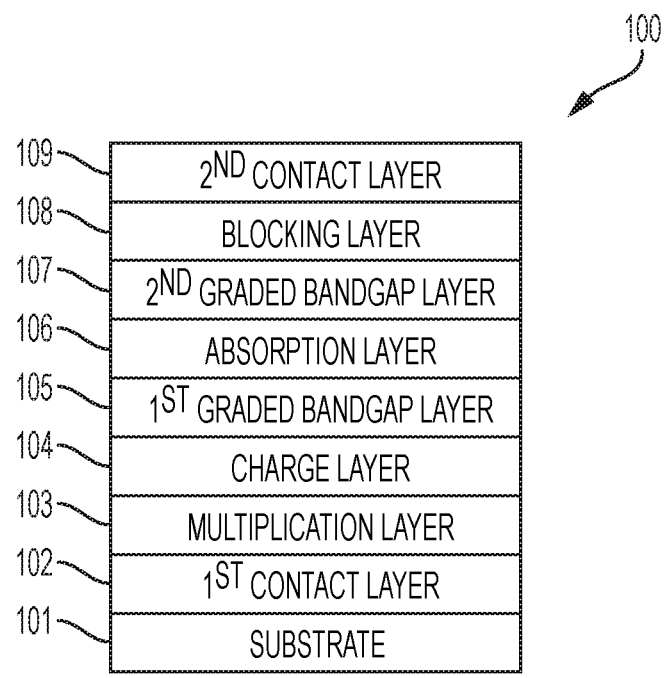
FIG. 1 schematically illustrates an aspect of an embodiment of an avalanche photodiode (APD) according to the present disclosure.

Although example embodiments of the present disclosure are explained in detail herein, it is to be understood that other embodiments are contemplated. Accordingly, it is not intended that the present disclosure be limited in its scope to the details of construction and arrangement of components set forth in the following description or illustrated in the drawings. The present disclosure is capable of other embodiments and of being practiced or carried out in various ways.

It must also be noted that, as used in the specification and the appended claims, the singular forms "a," "an" and "the" include plural referents unless the context clearly dictates otherwise. Ranges may be expressed herein as from "about" or "approximately" one particular value and/or to "about" or "approximately" another particular value. When such a range is expressed, other exemplary embodiments include from the one particular value and/or to the other particular value.

By "comprising" or "containing" or "including" is meant that at least the named compound, element, particle, or method step is present in the composition or article or method, but does not exclude the presence of other compounds, materials, particles, method steps, even if the other such compounds, material, particles, method steps have the same function as what is named.

In describing example embodiments, terminology will be resorted to for the sake of clarity. It is intended that each term contemplates its broadest meaning as understood by those skilled in the art and includes all technical equivalents that operate in a similar manner to accomplish a similar purpose. It is also to be understood that the mention of one or more steps of a method does not preclude the presence of additional method steps or intervening method steps between those steps expressly identified. Steps of a method may be performed in a different order than those described herein without departing from the scope of the present disclosure. Similarly, it is also to be understood that the mention of one or more components in a device or system does not preclude the presence of additional components or intervening components between those components expressly identified.

Some references, which may include various patents, patent applications, and publications, are cited in a reference list and discussed in the disclosure provided herein. The citation and/or discussion of such references is provided merely to clarify the description of the present disclosure and is not an admission that any such reference is "prior art" to any aspects of the present disclosure described herein. In terms of notation, "[n]" corresponds to the $n^{th}$ reference in the list. All references cited and discussed in this specification are incorporated herein by reference in their entireties and to the same extent as if each reference was individually incorporated by reference.

A detailed description of aspects of the present disclosure will now be provided with reference to the accompanying drawings. The drawings form a part hereof and show, by way of illustration, specific embodiments or examples. In referring to the drawings, like numerals represent like elements throughout the several figures.

FIG. 1 schematically illustrates an aspect of an embodiments of an avalanche photodiode (APD) 100, comprising, but not limited thereto, a substrate 101, first contact layer 102, multiplication layer 103, charge layer 104, first graded bandgap layer 105, absorption layer 106, second graded bandgap layer 108, and second contact layer 109; of which the materials and structure may vary as discussed and disclosed herein.

Figure 2:
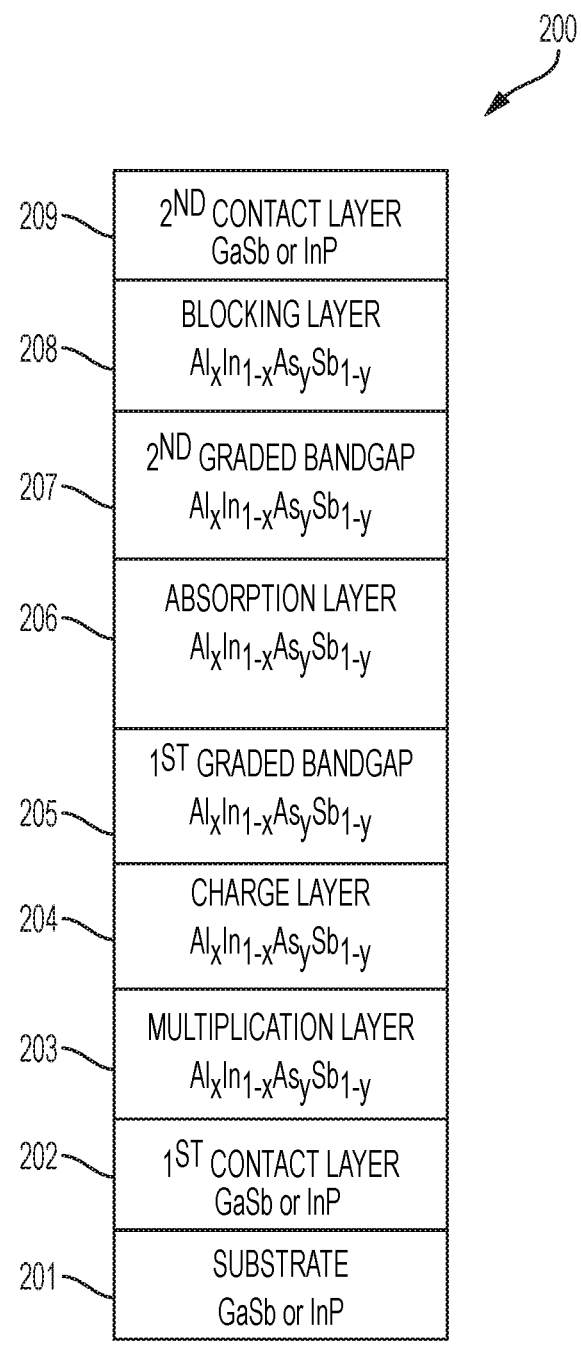
FIG. 2 schematically illustrates an aspect of an embodiment of an avalanche photodiode (APD) according to the present disclosure.
Figure 3:
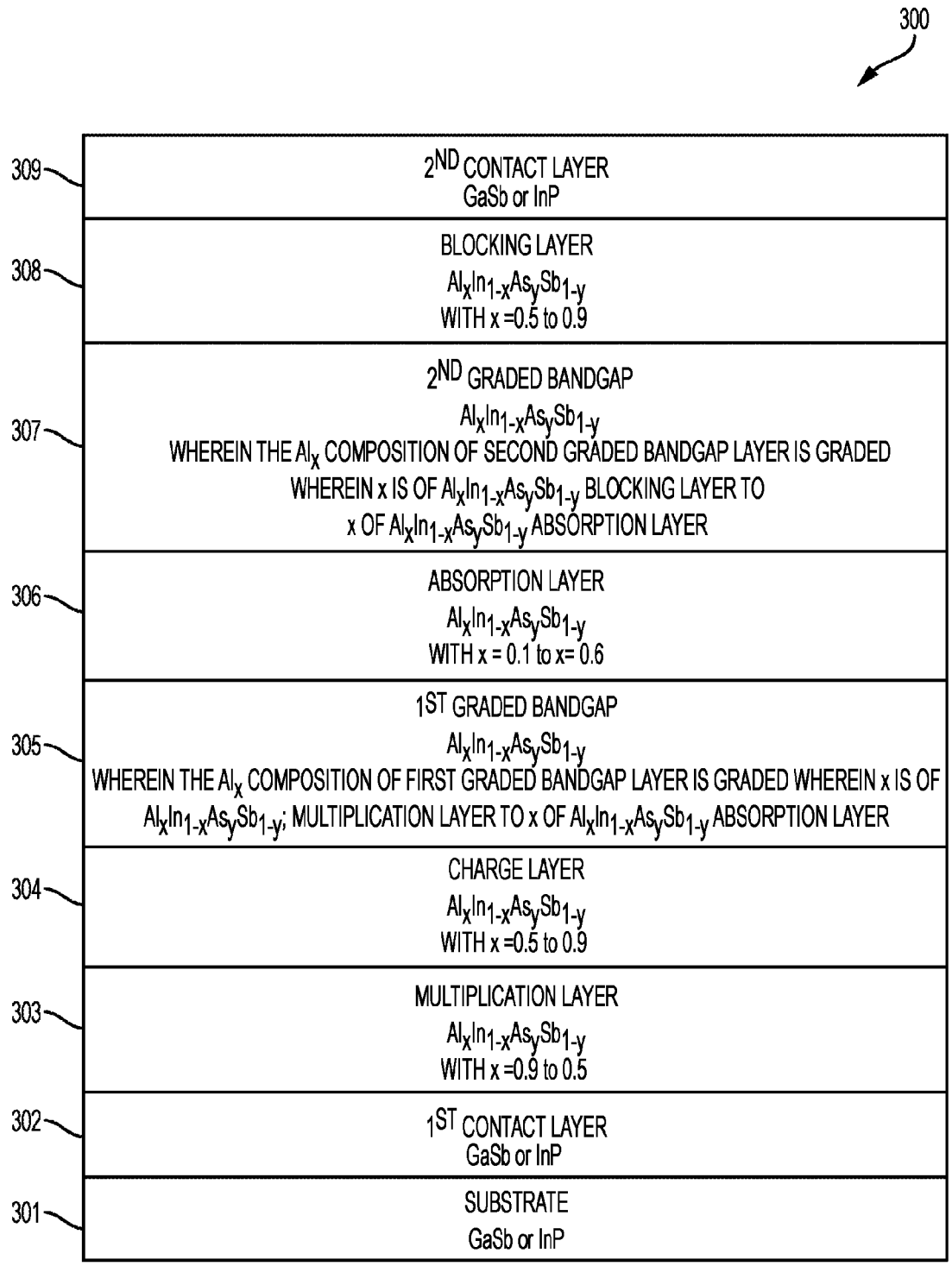
FIG. 3 schematically illustrates an aspect of an embodiment of an avalanche photodiode (APD) according to the present disclosure.

FIGS. 2 and 3 schematically illustrate aspects of various embodiments of an avalanche photodiode (APD) 200, 300 comprising, but not limited thereto, a first contact layer 202, 302 and a multiplication layer 203, 303 adjacent to the first contact layer 202, 302, wherein the multiplication layer 203, 303 may comprise AlInAsSb The APD 200, 300 may further comprise a charge layer 204, 304 adjacent to the multiplication layer 203, 303 opposite the first contact layer 202, 302, wherein the charge layer 204, 304 may comprise AlInAsSb. The APD 200, 300 may comprise an absorption layer 206, 306 adjacent to the charge layer 204, 304, opposite the multiplication layer 203, 303, wherein the absorption layer 206, 306 may comprises AlInAsSb. The APD 200, 300 may comprise a blocking layer 208, 308 adjacent to the absorption layer 206, 306, opposite the charge layer 204, 304. The APD 200, 300 may comprise a second contact layer 209, 309 adjacent the blocking layer, opposite the absorption layer.

In an embodiment of the APD 200, 300, the blocking layer 208, 308 of the APD 200, 300 may comprises AlInASb. The blocking layer 208, 308 may comprises $Al_xIn_{1-x}As_ySb_{1-y}$, with x=0.5 to 0.9. In an embodiment the blocking layer 208, 308 may have a thickness of approximately 100 nanometers, although may vary.

In an embodiment of the APD 200, 300, the AlInAsSb absorption layer 206, 306 may have a composition $Al_xIn_{1-x}As_ySb_{1-y}$, with x=0.1 to x=0.6. In an embodiment, the AlInAsSb absorption layer 206, 306 may have a thickness of approximately 100 nanometers to approximately 4,000 nanometers, although may vary.

In an embodiment of the APD 200, 300, the AlInAsSb charge layer 204, 304 may have a composition $Al_xIn_{1-x}As_ySb_{1-y}$, with x=0.5 to 0.9. In an embodiment, the AlInAsSb charge layer 204, 304 may have a thickness of approximately 150 nanometers, although may vary.

In an embodiment of the APD 200, 300, the AlInAsSb multiplication layer 203, 303, may have a composition $Al_xIn_{1-x}As_ySb_{1-y}$ with x=0.9 to 0.5. In an embodiment, the AlInAsSb multiplication layer 203, 303, may have a thickness of approximately 100 nanometers to approximately 2,000 nanometers.

In an embodiment of the APD 200, 300, it may further comprise a substrate layer 201, 301 positioned adjacent to the multiplication layer 203, 303, opposite the charge layer 204, 304. In an embodiment of the APD 200, 300, the substrate layer 201, 301 may comprise GaSb or InP.

In an embodiment of the APD 200, 300, whereby the blocking layer, 208, 308, absorption layer 206, 306, and the charge layer 204, 304 is comprised of $Al_xIn_{1-x}As_ySb_{1-y}$, then the composition $As_ySb_{1-y}$ may further be represented with y=x.

In an embodiment of the APD 200, 300, it may further comprise at least one contact 421 (shown in FIG. 4, for example) in electrical communication respectively with the second contact layer 209, 309 and the substrate 201, 301. In an embodiment, the at least one contact 421 (shown in FIG. 4, for example) may comprises titanium or gold, or other suitable material.

In an embodiment of the APD 200, 300, it may further comprise a first graded bandgap layer 205, 305 and second graded bandgap layer 207, 307 adjacent to opposite sides of the AlInAsSb absorption layer 206, 306. In an embodiment, the first graded bandgap layer 205, 305 may be between the AlInAsSb absorption layer 206, 306 and the AlInAsSb charge layer 204, 304. In an embodiment, the second graded bandgap layer 207, 307 may be between the AlInAsSb absorption layer 206, 306 and the blocking layer 208, 308.

In an embodiment of the APD 200, 300, the first graded bandgap layer 205, 305 may comprise $Al_xIn_{1-x}As_ySb_{1-y}$. In an embodiment, the $Al_x$ composition of the first graded bandgap layer 205, 305 is graded wherein x is between x of the $Al_xIn_{1-x}As_ySb_{1-y}$ multiplication layer 203, 303 to x of the $Al_xIn_{1-x}As_ySb_{1-y}$ absorption layer 206, 306.

In an embodiment, the composition of the first graded bandgap 205, 305 is graded from the composition of the multiplication layer 203, 303 to that of the absorption layer 206, 306, wherein the first graded bandgap 205, 305 is lattice matched to either the GaSb or InP substrate 201, 301.

In an embodiment, the $Al_x$ composition of the first graded bandgap 205, 305 is graded between lattice matched to the GaSb substrate 201, 301 or the InP substrate 201, 301.

In an embodiment, the first graded bandgap layer 205, 305 may have a thickness approximately 100 nanometers, although may vary.

In an embodiment of the APD 200, 300, the second graded bandgap layer 207, 307 may comprise $Al_xIn_{1-x}As_ySb_{1-y}$. In an embodiment, the $Al_x$ composition of the second graded bandgap layer 207, 307 is graded wherein x is of the $Al_xIn_{1-x}As_ySb_{1-y}$; blocking layer 208, 308 to x of the $Al_xIn_{1-x}As_ySb_{1-y}$ absorption layer 206, 306.

In an embodiment, the composition of the second graded bandgap 207, 307 is graded from the composition of the blocking layer 208, 308 to that of the absorption layer 206, 306, wherein the second graded bandgap is lattice matched to either the GaSb or InP substrate.

In an embodiment, the $Al_x$ composition of the second graded bandgap 207, 307 is graded between lattice matched to the GaSb substrate 201, 301 or the InP substrate 201, 301.

In an embodiment, the second graded bandgap layer 207, 307 may have a thickness approximately 50 nanometers, although may vary.

In an embodiment of the APD 200, 300, the first contact layer 202, 302 comprises GaSb or InP.

In an embodiment of the APD 200, 300, the second contact layer 209, 309 comprises GaSb or InP.

Any of the components or modules referred to with regards to any of the present invention embodiments of the device discussed herein, may be integrally or separately formed with one another. Further, redundant functions or structures of the components or modules may be implemented.

Any of the components or modules may be a variety of widths and lengths as desired or required for operational purposes.

It should be appreciated that various sizes, dimensions, contours, rigidity, shapes, flexibility and materials of any of the components or portions of components in the various embodiments of the device discussed throughout may be varied and utilized as desired or required. Similarly, locations and alignments of the various components may vary as desired or required. Moreover, modes and mechanisms for connectivity or interchangeability may vary.

It should be appreciated that the device and related components of the device discussed herein may take on all shapes along the entire continual geometric spectrum of manipulation of x, y and z planes to provide and meet the environmental, and structural demands and operational requirements. Moreover, locations, connections and alignments of the various components may vary as desired or required.

EXAMPLES

Practice of an aspect of an embodiment (or embodiments) of the invention will be still more fully understood from the following examples and experimental results, which are presented herein for illustration only and should not be construed as limiting the invention in any way.

Example and Experimental Results Set No. 1

An aspect of an embodiment of the present invention provides, among other things, separate absorption, charge, and multiplication (SACM) APDs fabricated from $Al_xIn_{1-x}As_ySb_{1-y}$, grown on GaSb. The excess noise factor of the $Al_{0.7}In_{0.3}As_{0.3}Sb_{0.7}$ multiplication region is characterized by a k value of ~0.01, which is comparable to, or below, that of Si. Further, the lattice-matched $Al_{0.4}In_{0.6}As_{0.6}Sb_{0.4}$ absorbing region extends the operating wavelength to the short-wavelength infrared (SWIR) spectrum and offers gains as high as 50. These APDs achieve noise comparable to state-of-the-art Si APDs while maintaining low dark current similar to that of SWIR III-V compound APDs and significantly less than Ge on Si APDs.

Crystal Growth and Device Fabrication

Figure 4:
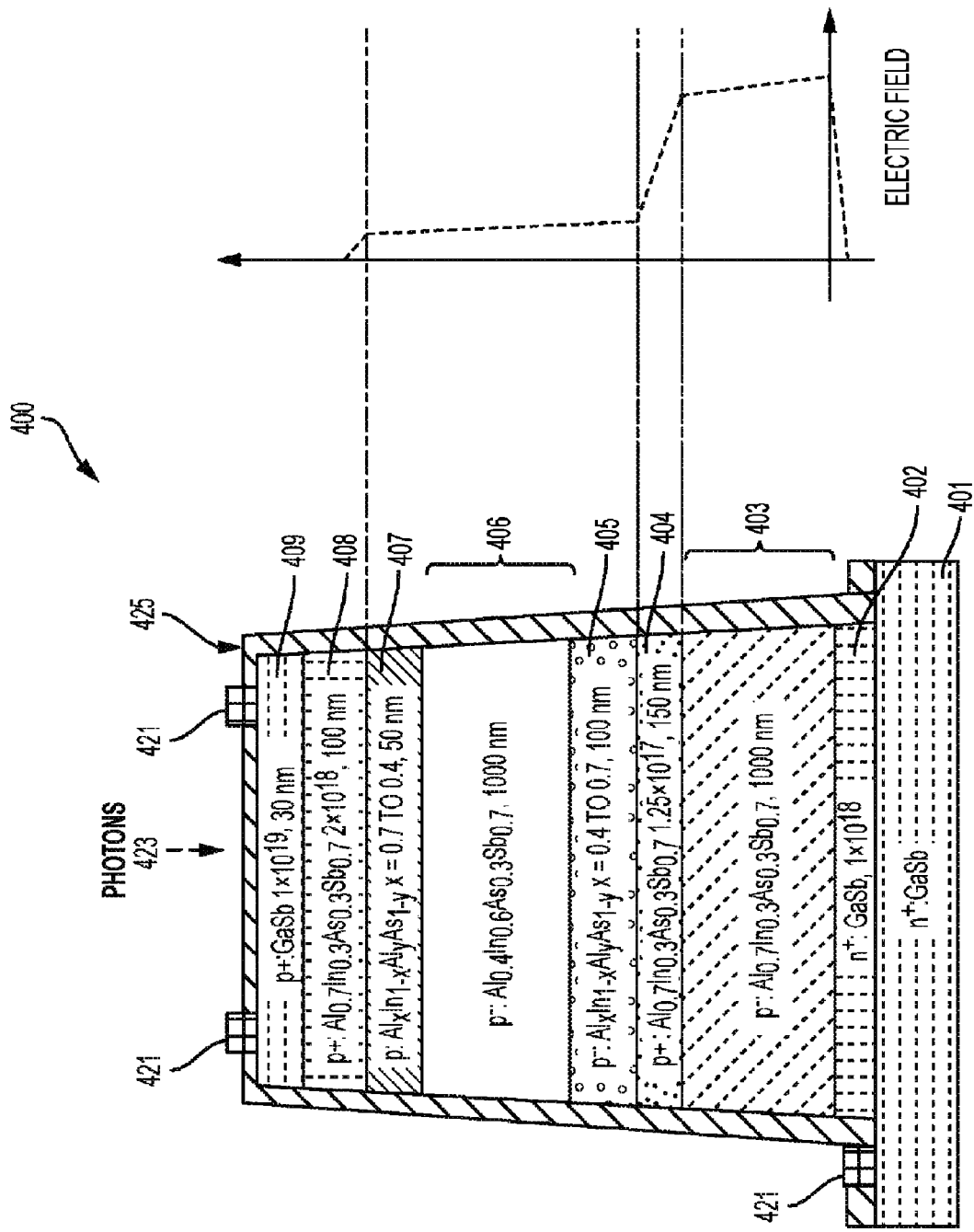
FIG. 4 schematically illustrates an aspect of an embodiment of an avalanche photodiode (APD) according to the present disclosure with a corresponding electric field profile.

The epitaxial layers were grown on n-type Te-doped GaSb (001) substrates by solid-source molecular beam epitaxy (MBE). In order to bypass the wide miscibility gap present in the $Al_xIn_{1-x}As_ySb_{1-y}$ material system, these layers were grown as a digital alloy of the binary alloys AlAs, AlSb, InAs, and InSb, using a digital alloy period of 3 nm and the following layer sequence: AlSb, AlAs, AlSb, InSb, InAs, Sb. This approach has enabled a number of devices, including the first working staircase APD and a low-noise $Al_{0.7}In_{0.3}As_{0.3}Sb_{0.7}$ APD. Photoluminescence results indicate that the bandgap of $Al_{0.4}In_{0.6}As_{0.6}Sb_{0.6}$ is ~0.7 eV, and the bandgap of $Al_{0.7}In_{0.3}As_{0.3}Sb_{0.7}$ is 1.16 eV. By combining and utilizing their advantages, infrared photons can be absorbed in the $Al_{0.4}In_{0.6}As_{0.6}Sb_{0.6}$ layer and photo-generated carriers can be multiplied in $Al_{0.7}In_{0.3}As_{0.3}Sb_{0.7}$. A schematic cross section of the $Al_xIn_{1-x}As_ySb_{1-y}$ SACM APD is shown in FIG. 4. Also shown in FIG. 4 is an electric field profile of $Al_xIn_{1-x}As_ySb_{1-y}$ SACM APD. FIG. 4 schematically illustrates an aspect of an embodiments of an avalanche photodiode (APD) according to the present disclosure. FIG. 4 schematically illustrates an aspect of an embodiments of an avalanche photodiode (APD) 400, comprising, but not limited thereto, a substrate 401 (for example n type), first contact layer 402 (for example n type contact), multiplication layer 403, charge layer 404, first graded bandgap layer 405, absorption layer 406, second graded bandgap layer 407, blocking layer 408, and second contact layer 409 (for example, p-type contact). Also shown is a coating 425 (for example SU-8 coating) and ohmic contacts 421 (for example, Ti or Pt). The structure includes a top GaSb contact layer. Beneath the p-type contact layer is a $p^+$:$Al_{0.7}In_{0.3}As_{0.3}Sb_{0.7}$ ($2\times10^{18}$ cm$^{-3}$, 100 nm) blocking layer. The $p^-$: $Al_{0.4}In_{0.6}As_{0.6}Sb_{0.4}$ (1,000 nm) absorbing layer is sandwiched between two 100 nm-thick (or one 100 nm and the other 50 nm thick) $p^+$:$Al_xIn_{1-x}As_ySb_{1-y}$ regions [or alternatively $p^+$:$Al_xIn_{1-x}Al_yAs_{1-y}$ regions] in which the Al composition is graded between x=0.4 and 0.7. Beneath the absorbing region is a $p^+$:$Al_{0.7}In_{0.3}As_{0.3}Sb_{0.7}$ ($1.25\times10^{17}$ cm$^{-3}$, 150 nm) charge layer, the $p^-$:$Al_{0.7}In_{0.3}As_{0.3}Sb_{0.7}$ (1000 nm) multiplication layer, and an $n^+$:GaSb, $1\sim9\times10^{17}$ n-type contact layer. When reverse biased, strong electric field is formed in multiplication layer to enable impact ionization, while low electric field is limited by charge layer in absorption layer to help photoelectron drifting. When reverse biased at 50 V, simulation indicates that the average electric field strengths in the absorption and multiplication layers are <100 kV/cm and ~800 kV/cm, respectively. Circular mesas were defined by standard photolithography and $N_2$/$Cl_2$ inductive coupled plasma (ICP) dry etching. Etching was terminated with a surface-smoothing treatment of bromine methanol. In order to improve passivation and thus reduce the surface leakage current, an SU-8 coating was spun on immediately after the surface treatment. Titanium/gold contacts were deposited by e-beam evaporation onto the mesa and the substrate.

Results and Discussions

Figure 5:
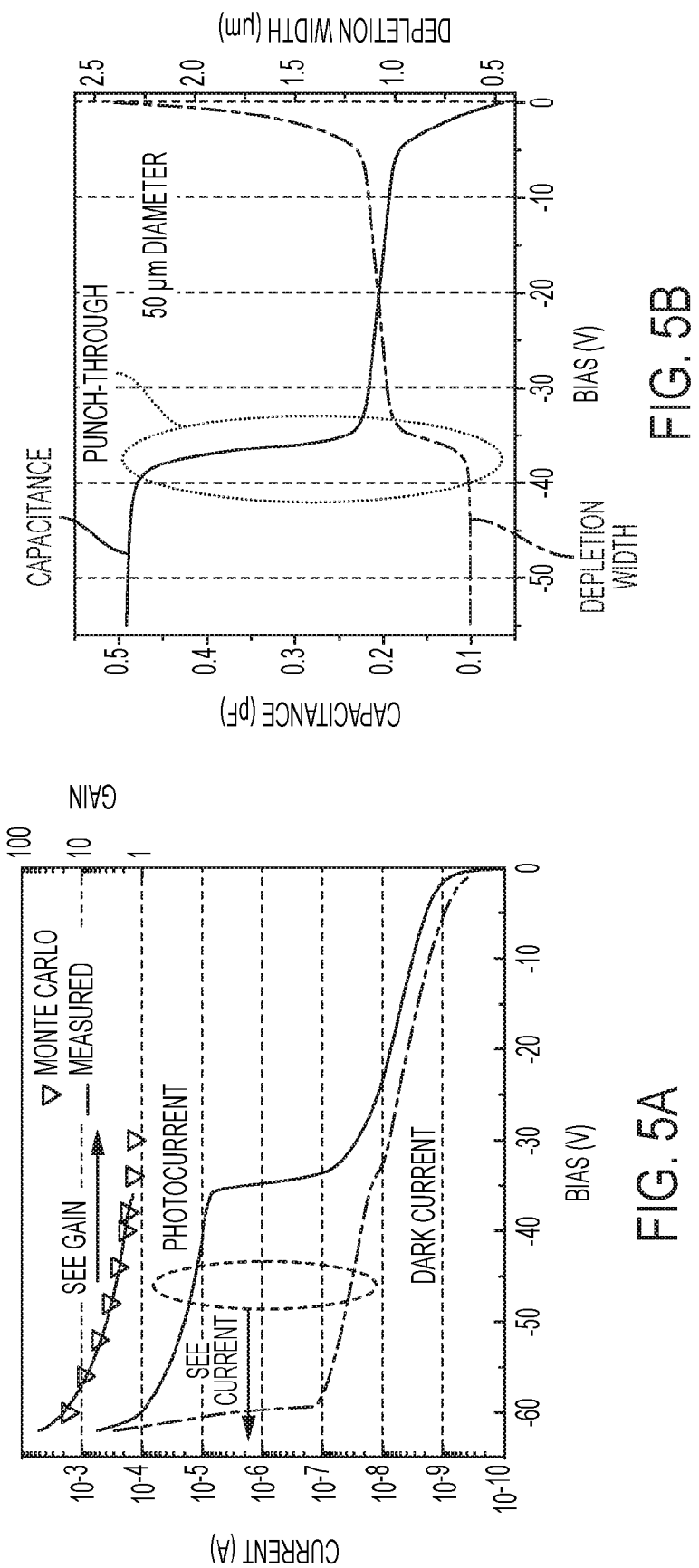
FIG. 5 (A) graphically illustrates a dark current, photocurrent, and measured and simulated (∇) gain versus reverse bias of a 50-μm-diameter $Al_xIn_{1-x}As_ySb_{1-y}$ SACM APD at 300 K.

The dark current, photocurrent, and gain versus bias voltage of a 50 μm-diameter SACM APD are shown in FIG. 5(A). The dark current at 95% breakdown is ~120 nA, which is approximately 100× lower than that of Ge on Si APDs and comparable to that of AlInAs/InGaAs APDs. The gain is plotted on the right vertical axis. Gain values as high as 50 have been observed. A Monte-Carlo simulation was employed to study the multiplication mechanism. The impact ionization rate, $P_{ii}$, is calculated using the Keldysh formula:

$$P_{ii} = \begin{cases} 0, & \text{if } E < E_{th} \\ C_{ii}\left(\dfrac{E}{E_{th}} - 1\right)^r, & \text{if } E \geq E_{th} \end{cases}. \qquad (3)$$

TABLE 1

Parameters used in Monte-Carlo simulation.

| Simulation Parameters | Electron | Hole |
|---|---|---|
| effective mass (m*/m⁰) | 0.071 | 0.35 |
| $C_{ii}$ | $8.0 \times 10^{14}$ | $8.0 \times 10^{12}$ |
| r | 3 | 3 |
| $E_{th}$ | 2 | 10 |
| Static dielectric constant | 15.5 | |
| High frequency dielectric constant | 13.7 | |
| Acoustic wave velocity (m/s) | 2950 | |
| Acoustic phonon energy (eV) | 0.011 | |
| Optical phonon energy (eV) | 0.024 | |
| Intervalley phonon energy (eV) | 0.013 | |

Figure 6:
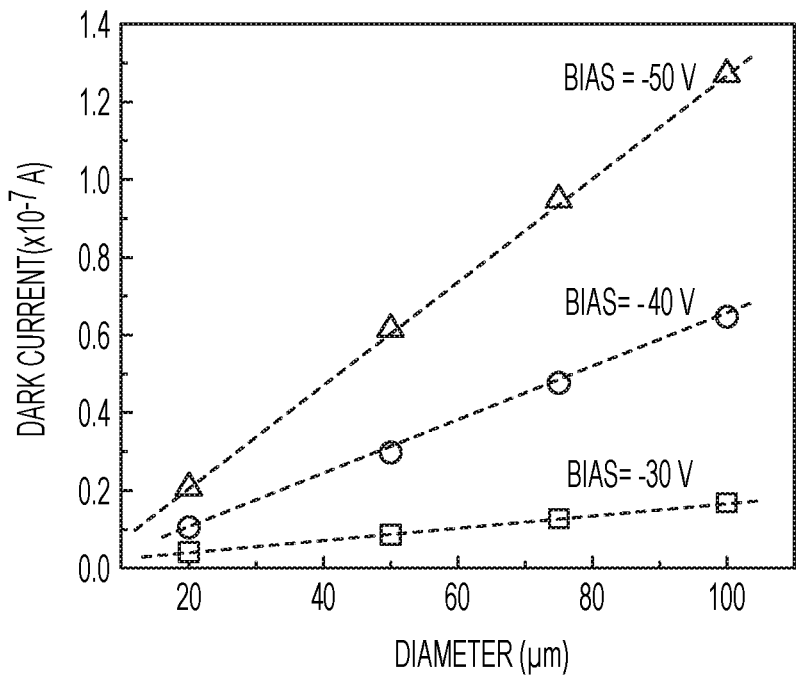
FIG. 6 graphically illustrates the dark current size dependence study of $Al_xIn_{1-x}As_ySb_{1-y}$ SACM APDs at 300 K. Results show that dark current increases linearly with diameter of devices at three tested bias, −30 V −40 V and −50 V, which indicates that dark current is dominated by surface leakage.

The phonon scattering rate, $C_{ii}$, and threshold energy, $E_{th}$, are treated as fitting parameters. Some important model parameters are listed in Table 1. A good fit to the measured gain was achieved with these parameters. The step in the photocurrent near −38 V occurs when the edge of the depletion region reaches the absorbing layer, which is referred to as punch-through. The depletion width versus bias was calculated from capacitance measurement at different bias and is shown in FIG. 5(B). FIG. 6 shows the dark current versus device diameter for bias voltage in the range −30 V to −50 V. The dark current scales with perimeter, which indicates that surface leakage dominates the dark current. To further characterize the dark current, a temperature dependence study from 150 K to 300 K in steps of 25 K was performed with 5 devices. By fitting the dark current ($I_{dN}$) with temperature (T) exponentially, the activation energy can be determined using the relation:

$$I_{dN} \propto T^2 \exp\left(\frac{-E_a}{k_B T}\right) \quad (4)$$

where $k_B$ is the Boltzmann constant and $E_a$ is the activation energy. For this temperature range the activation energy is 0.29 eV±0.01 eV, which is approximately half the bandgap of $Al_{0.4}In_{0.6}As_{0.6}Sb_{0.4}$. This indicates that the dark current is primarily generated in the absorption layer through mid-bandgap states.

Figure 7:
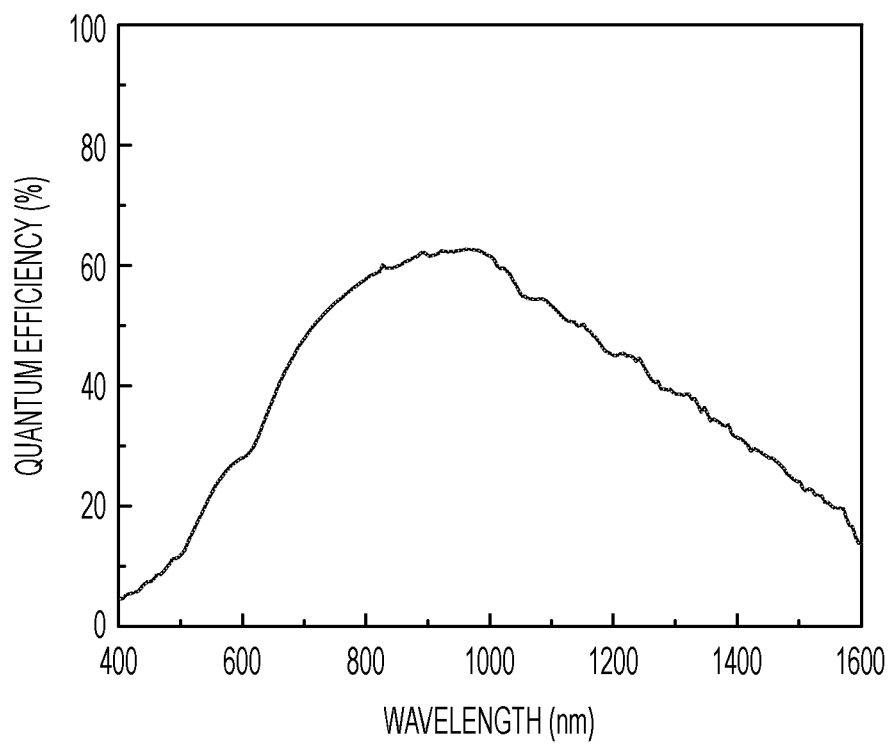
FIG. 7 graphically illustrates the external quantum efficiency versus wavelength of a 150-μm-diameter $Al_xIn_{1-x}As_ySb_{1-y}$ SACM APD at 300 K.
Figure 8:
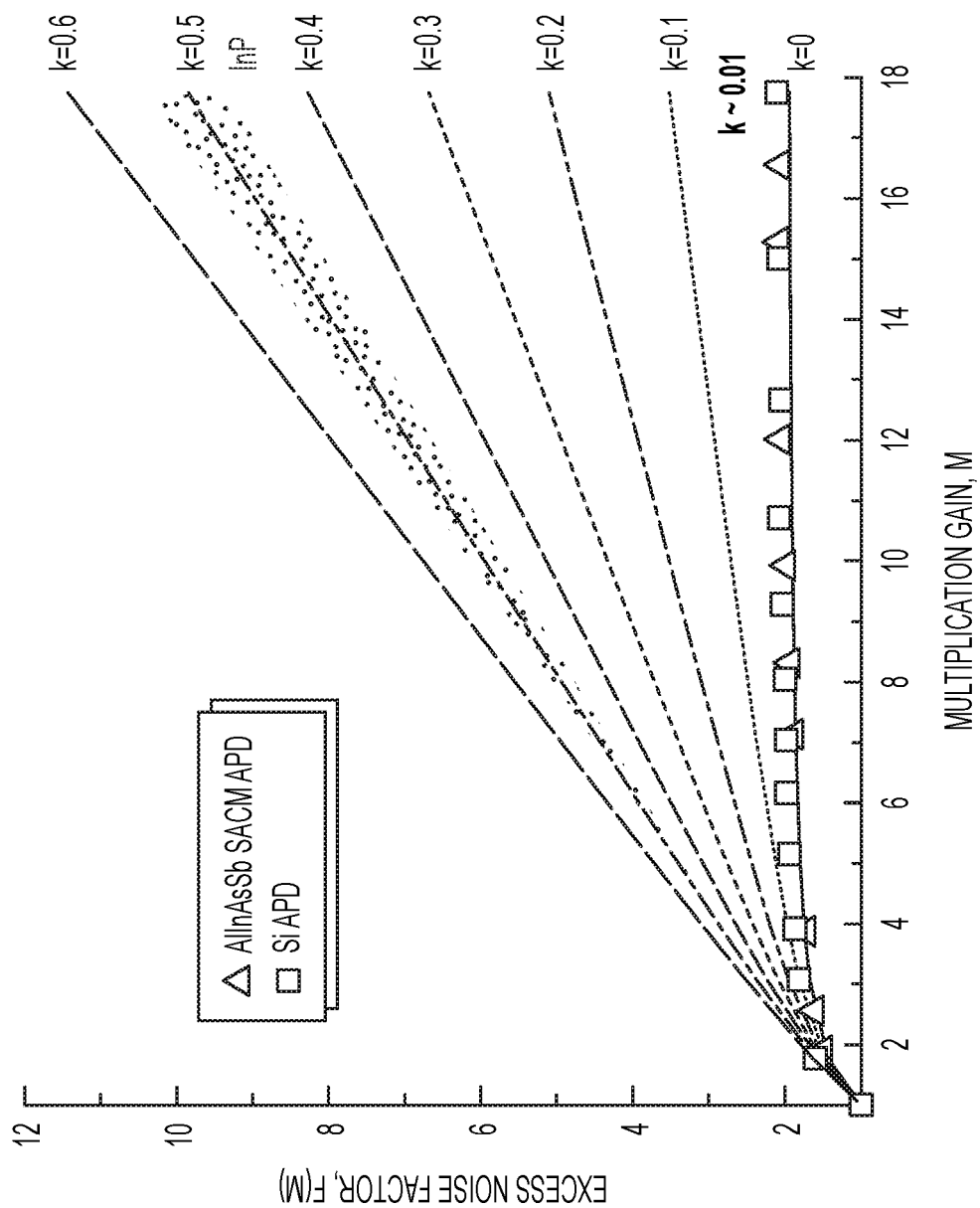
FIG. 8 graphically illustrates the measured excess noise factor versus gain a 50-μm-diameter $Al_xIn_{1-x}As_ySb_{1-y}$ SACM APD (▲) and a commercial Si APD (■). The solid lines are plots of the excess noise factor using the local field model for k values from 0 to 0.6. Both the Si and $Al_xIn_{1-x}As_ySb_{1-y}$ SACM APD are characterized by a k value of ~0.01. The shaded region (speckled) for k≥0.45 denotes typical values for APDs that employ InP multiplication regions.

Owing to the high field in the multiplication layer, there is a small level of impact ionization at punch-through. By fitting the excess noise using the algorithm reported by H.-D. Liu et al., the gain at punch-through was determined to be 1.7. This fit was confirmed by comparing responsivities with an $Al_{0.4}In_{0.6}As_{0.6}Sb_{0.4}$ control p-i-n photodiode, which has exactly the same 1000 nm absorption layer as the SACM APDs. This is also consistent with measurements of the gain in an $Al_{0.7}In_{0.3}As_{0.3}Sb_{0.7}$ homojunction APD at the same electric field as that of the SACM APD at punch through. The normalized external quantum efficiency was measured at −38 V bias using a tungsten-halogen light source, a spectrometer, and a lock-in amplifier. As shown in FIG. 7, the optical cutoff wavelength is >1.6 µm. Note that the absorption layer is only 1,000 nm thick, there is no anti-reflection coating, and the structure is such that photons make a single pass across the absorber, i.e., there is no "back reflection". Higher quantum efficiency, particularly at longer wavelengths, can be achieved with thicker $Al_{0.4}In_{0.6}As_{0.6}Sb_{0.4}$ absorption layers and by adding an anti-reflection coating to the top surface. FIG. 8 shows the excess noise figure F(M), as a function of the multiplication gain, for both the $Al_xIn_{1-x}As_ySb_{1-y}$ SACM APD (▲) and a commercial Si APD (■). The solid lines are plots of the excess noise for k-values from 0 to 0.6 using the local-field model. The measured $Al_xIn_{1-x}As_ySb_{1-y}$ SACM APD excess noise corresponds to an estimated k-value of 0.01, which is comparable to or less than that of Si.

CONCLUSION

An aspect of an embodiment of the present invention provides, among other things, SACM avalanche photo-diodes fabricated from $Al_xIn_{1-x}As_ySb_{1-y}$, grown on GaSb. The excess noise factor of the $Al_xIn_{1-x}As_ySb_{1-y}$ SACM APDs multiplication is characterized by a k value of 0.01 and gain as high as 50 has been achieved. Further, the lattice-matched $Al_{0.4}In_{0.6}As_{0.3}Sb_{0.7}$ absorbing region extends the operating wavelength to the SWIR spectrum. These APDs combine the excellent gain/noise characteristics of Si with the low dark current and high speed of the III-V compound APDs.

Example and Experimental Results Set No. 2

Previous growths of the material have achieved only as much as a 30% aluminum fraction, but an aspect of an embodiment of the present device has achieved 70% aluminum mole fractions as high as 80% by inserting an additional AlAs layer into each digital alloy period. Provided herein provides the first device and related study of a p-i-n structure APDs fabricated from this material. These APDs offer, but not limited thereto, the advantages of III-V compound direct bandgap APDs with regard to high absorption coefficient and a lattice-matched material system that provides the flexibility to design complex structures to maximize performance and enable operation in different spectral regions. In addition, these direct-bandgap APDs exhibit bulk excess noise comparable to Si without taking advantage of the dead-space effect in a thin multiplication region.

Epitaxial Crystal Growth and Device Fabrication

The samples in this study were grown on n-type Te-doped GaSb (001) substrates by solid-source molecular beam epi-taxy (MBE). In order to bypass the wide miscibility gap present in the $Al_xIn_{1-x}As_ySb_{1-y}$ material system, these layers were grown as a digital alloy of the binary alloys AlAs, AlSb, InAs, and InSb, using a digital alloy period of 3 nm and the following shutter sequence: AlSb, AlAs, AlSb, InSb, InAs, Sb. Further details of the growth and properties of the resulting $Al_xIn_{1-x}As_ySb_{1-y}$ digital alloy films are provided elsewhere.

Figure 9:
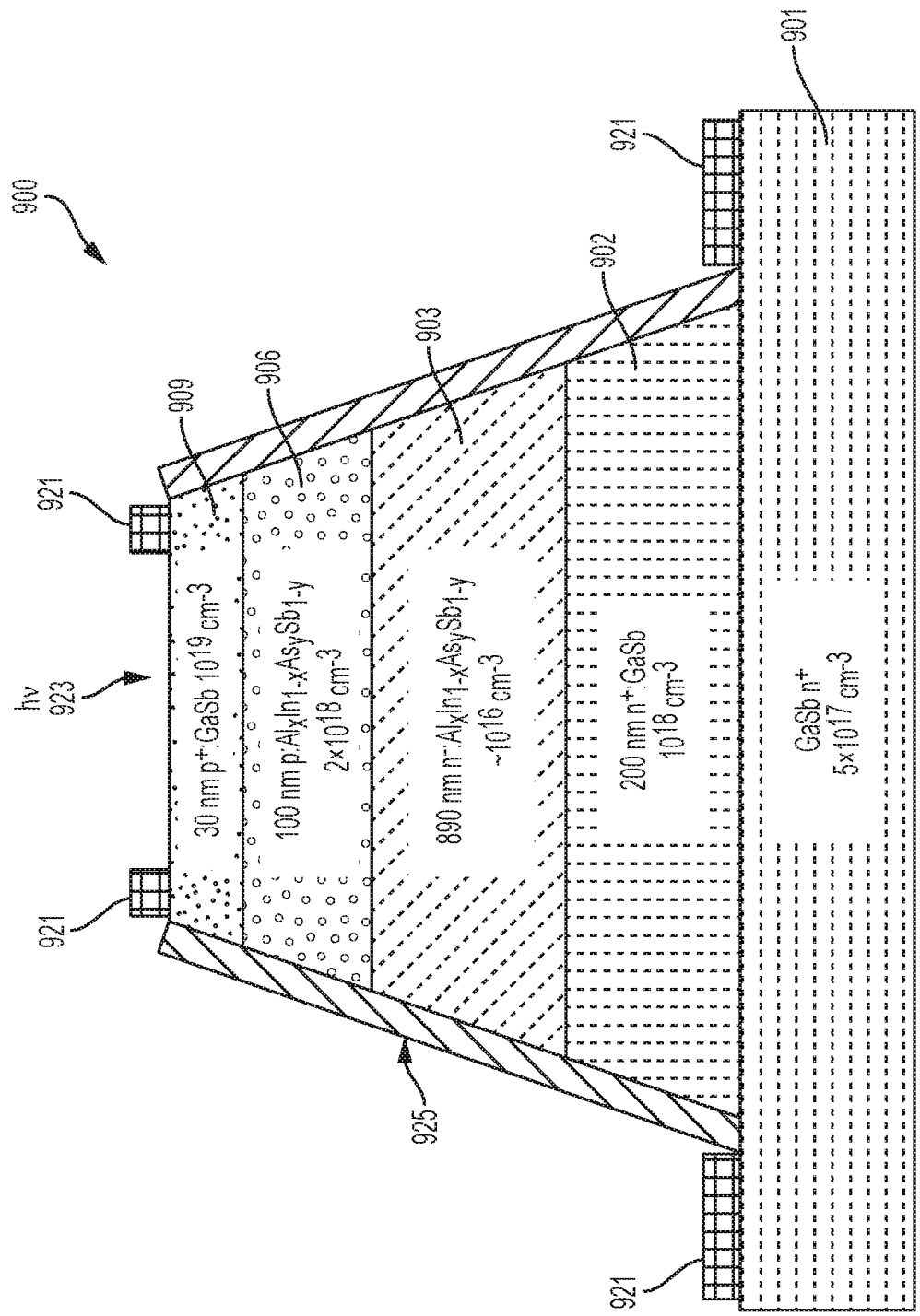
FIG. 9 schematically illustrates an aspect of an embodiments of an avalanche photodiode (APD) according to the present disclosure, which provides a cross-sectional of $Al_xIn_{1-x}As_ySb_{1-y}$ avalanche photodiode (such as a $Al_{0.7}In_{0.3}As_{0.3}Sb_{0.7}$ avalanche photodiode).

A cross-sectional schematic of the $Al_{0.7}In_{0.3}As_{0.3}Sb_{0.7}$ device is shown in FIG. 9. FIG. 9 schematically illustrates an aspect of an embodiments of an avalanche photodiode (APD) according to the present disclosure. FIG. 9 schematically illustrates an aspect of an embodiments of an avalanche photodiode (APD) 900, comprising, but not limited thereto, a substrate 901 (for example n type substrate), first contact layer 902, multiplication layer 903, absorption layer 906, and second contact layer 909 (for example, p type contact). Also shown is a coating 925 (for example, sidewall passivation) and ohmic contacts 921 (for example, Ti or Pt). The structure includes a top GaSb layer to reduce contact resistance, improve contact adhesion, and protect the underlying Al-containing layers from oxidation. Circular mesas were defined using standard photolithography and wet-etched using an $HCl:H_2O_2:H_2O$ solution. Etching was terminated with a surface-smoothing treatment of bromine methanol. In order to improve passivation and thus reduce the surface leakage current, an SU-8 coating was spun on immediately after the surface treatment. Titanium/gold contacts were deposited by e-beam evaporation onto the mesa and the substrate. For some devices, the GaSb top contact layer was removed except under the p-type contacts, in order to eliminate its parasitic optical absorption. AZ 3400 was used to selectively etch the GaSb prior to SU-8 coating.

Results and Discussion

Figure 10:
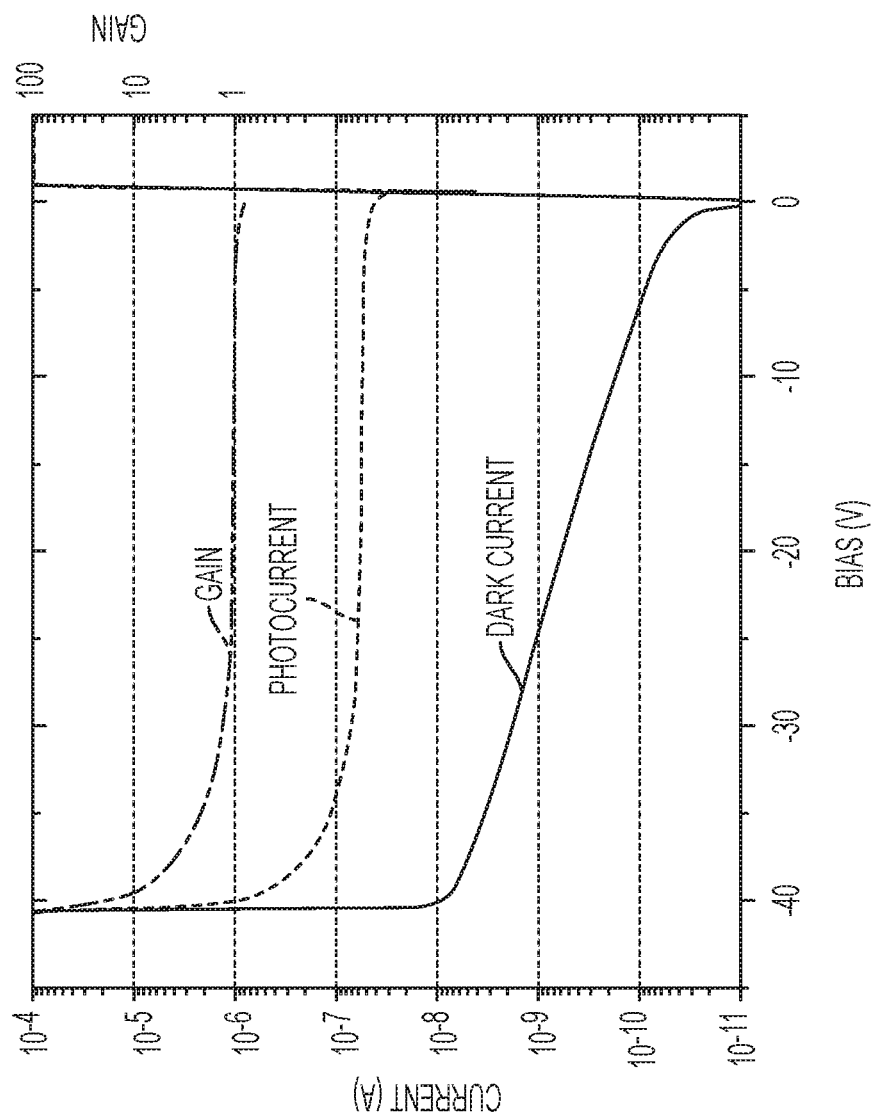
FIG. 10 graphically illustrates the dark current (solid line), photocurrent (dashed line), and gain (short dashed and long dashed) versus bias for a 30 μm-diameter $Al_{0.7}In_{0.3}As_{0.3}Sb_{0.7}$ avalanche photodiode.
Figure 11:
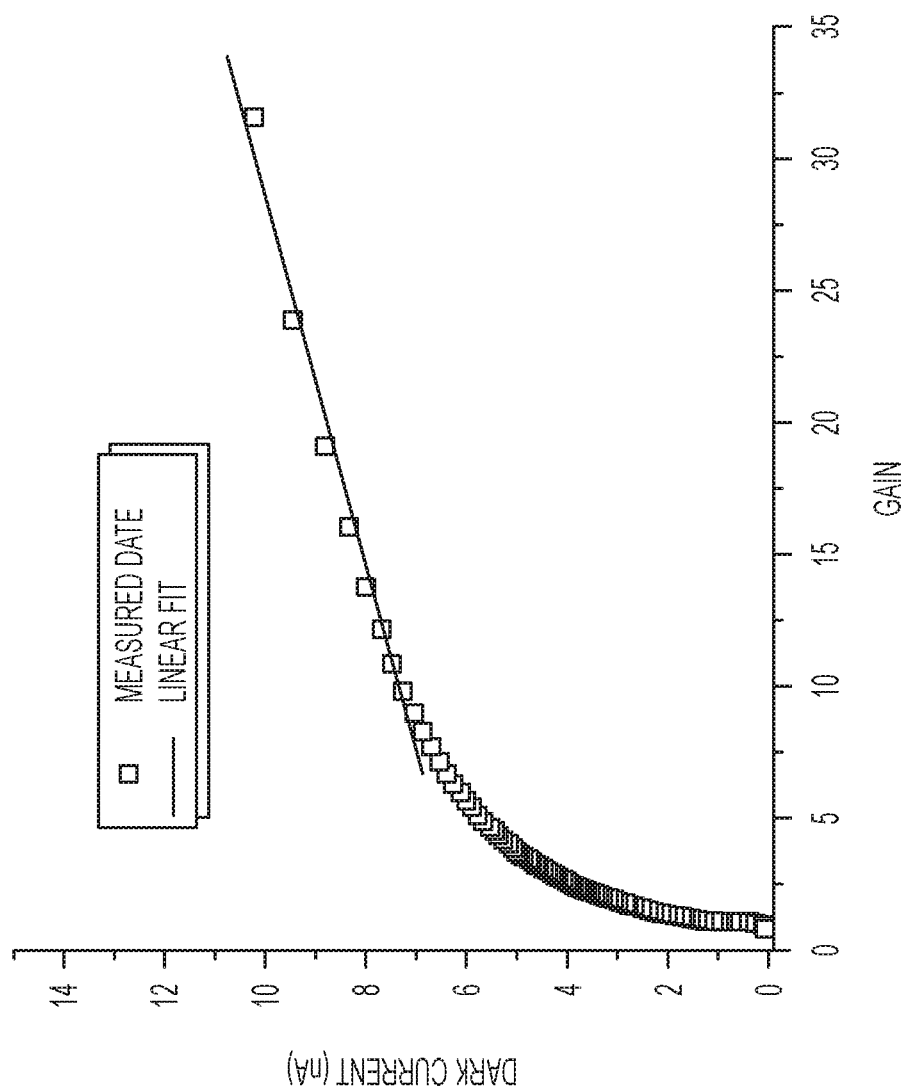
FIG. 11 graphically illustrates the dark current characteristics of 30 μm-diameter $Al_{0.7}In_{0.3}As_{0.3}Sb_{0.7}$ avalanche photodiode. The linear fit shows that the primary multiplied dark current is 6 nA and the unmultiplied dark current, which is typically associated with surface leakage is 0.14 nA.

All measurements in this paper were carried out at room temperature. FIG. 10 shows the dark current, photocurrent, and gain versus voltage for a 30 μm-diameter $Al_{0.7}In_{0.3}As_{0.3}Sb_{0.7}$ APD. The slight increase in photocurrent at low bias reflects the increase in depletion width in the n⁻ layer. Capacitance-voltage measurements indicate this layer is fully depleted at −3 V. From −3 V and to −25 V the photocurrent is relatively independent of the bias voltage. The photocurrent at −5 V bias was designated as the unity gain point of the device. Breakdown occurred at a reverse bias of 40.5 V, corresponding to a peak electric field of ~530 kV/cm. The maximum stable gain reached before breakdown was 95. The dark current was ~4 nA ($6×10^{-4}$ A/cm²) at 90% of breakdown. Total leakage current, ID, can be expressed as: $I_D=I_{DS}+I_{DB}×M$, where $I_{DB}$ is the multiplied dark current and $I_{DS}$ is the surface leakage current. FIG. 11 shows the dark current versus gain for a 30 μm-diameter $Al_{0.7}In_{0.3}As_{0.3}Sb_{0.7}$ APD. The linear fit corresponds to $I_{DS}≈6$ nA and $I_{DB}≈0.14$ nA. These measurements indicate that leakage is surface dominated, but further study of passivation techniques promise to push toward bulk leakage, further decreasing dark current values.

Figure 12:
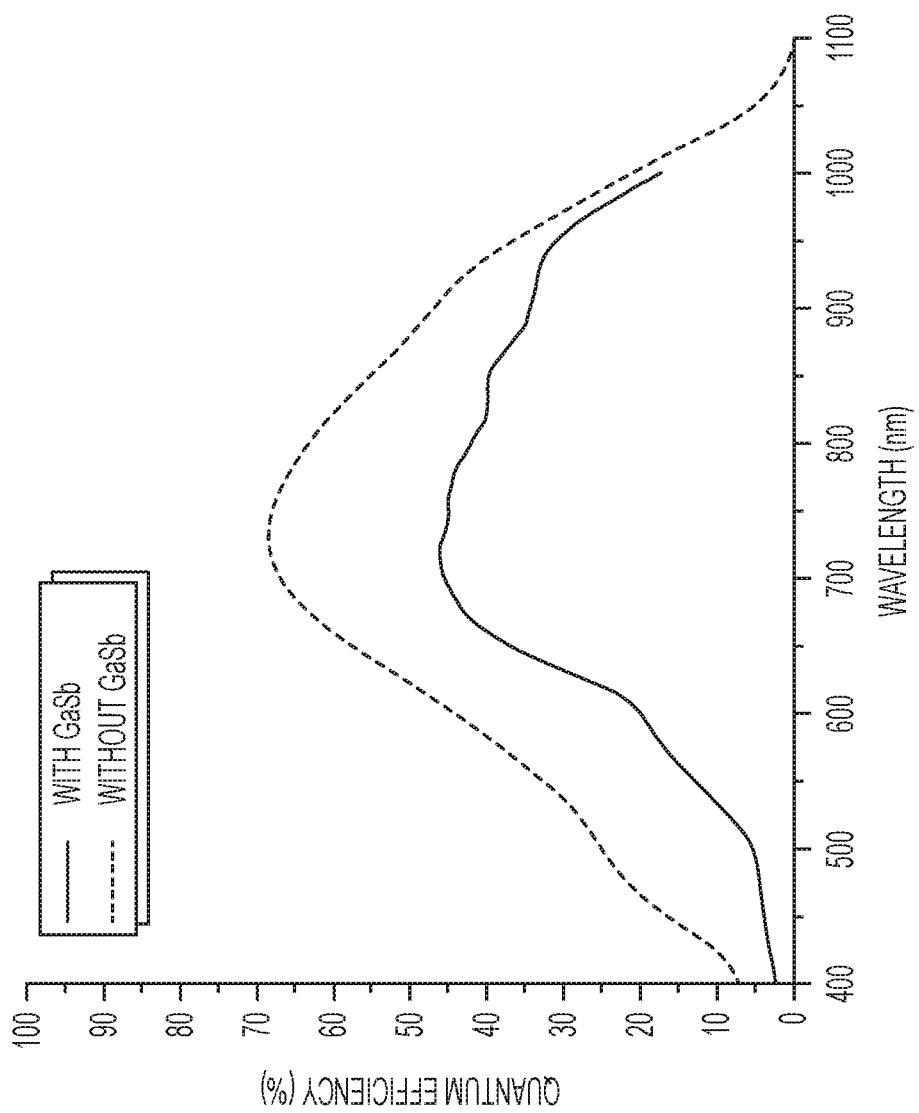
FIG. 12 graphically illustrates the external quantum efficiency versus wavelength for devices with and without the top GaSb layer.

FIG. 12 shows the external quantum efficiency versus wavelength at −5 V bias. Measurements were taken using a tungsten-halogen light source, a monochromater, and a lock-in amplifier. The measured data was referenced to a calibrated silicon photodiode. Collection of electrons created by absorption in the GaSb top contact layer is poor due to surface recombination and a barrier at the GaSb/$Al_{0.7}In_{0.3}As_{0.3}Sb_{0.7}$ interface. Prior to removing the GaSb layer, the quantum efficiency is above 30% for wavelengths between 630 nm and 960 nm, peaking at 46% at 715 nm. After its removal, the efficiency increases as much as 20% from 500 nm to 850 nm, reaching ~68% near 700 nm. The present inventors note that an anti-reflection coating has not been applied to these devices. If the absorption coefficient, which is not yet known for this material system, is on the order of $10^4$ cm⁻¹, since the air-semiconductor reflectivity without and antireflection coating is ~30%, a maximum efficiency of ~70% would be expected, which is close to the measured value. The long-wavelength cutoff is near 1.1 μm, which is the same as that of Si. However, by reducing the Al content in the $Al_xIn_{1-x}As_ySb_{1-y}$ to 60% the cutoff can be pushed to ~1.2 μm, which will cover the 1.064 μm wavelength of Nd:YAG lasers.

Figure 13:
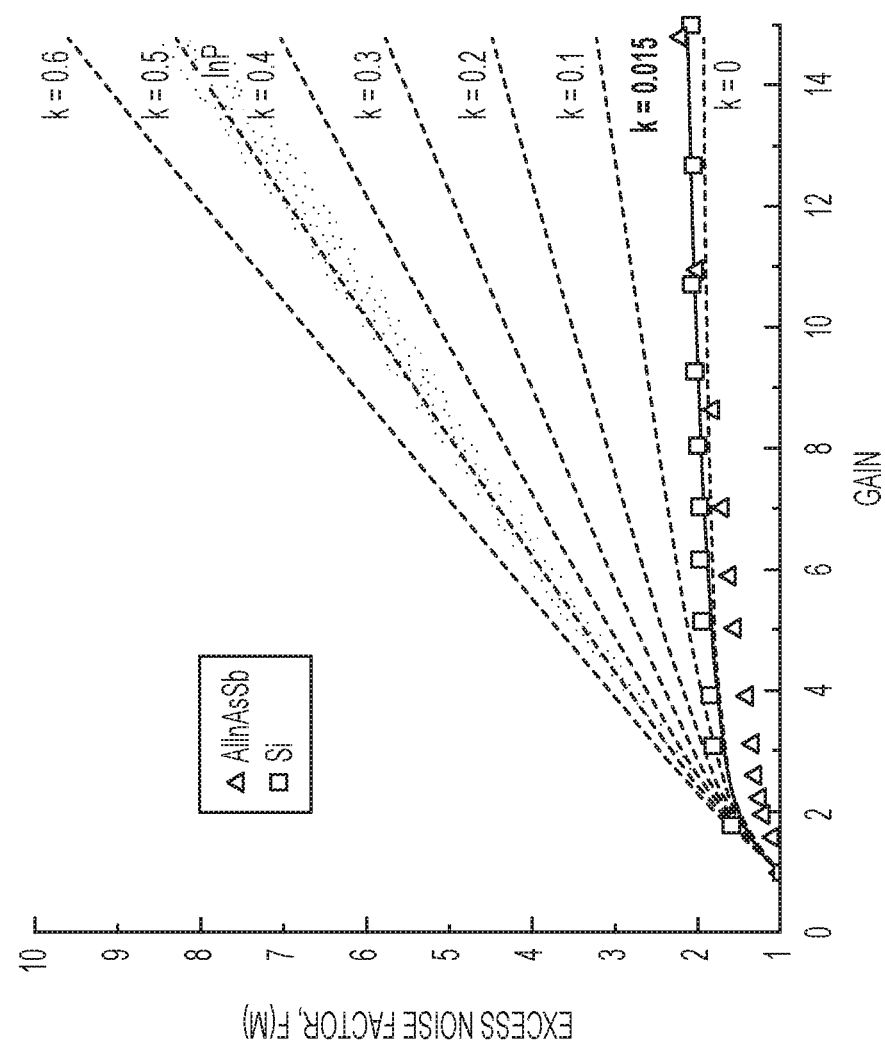
FIG. 13 graphically illustrates the measured excess noise factor versus gain for an $Al_{0.7}In_{0.3}As_{0.3}Sb_{0.7}$ APD (▲) and a Si APD (□). The solid lines are plots of the excess noise factor using the local field model for k values from 0 to 0.5. Both the Si and $Al_{0.7}In_{0.3}As_{0.3}Sb_{0.7}$ APD are characterized by a k value of 0.015. The shaded region (speckled) for k≥0.45 denotes typical values for APDs that employ InP multiplication regions.

FIG. 13 shows the excess noise figure, as a function of the multiplication gain, for both an $Al_{0.7}In_{0.3}As_{0.3}Sb_{0.7}$ APD (□) and a Si APD (▲) measured by an HP 8970 noise figure meter. The solid lines are plots of the excess noise for k-values from 0 to 0.6 using the local-field model. The measured $Al_{0.7}In_{0.3}As_{0.3}Sb_{0.7}$ APD excess noise corresponds to an estimated k-value of 0.015, and is comparable to the Si APD. For several decades Si APDs have been the standard for low noise and InP is the material most widely deployed for telecommunications APDs. The k values for commercial Si APDs fall between 0.02 and 0.06, while InP typically exhibits k values between 0.45 and 0.52, as denoted by the shaded region (Speckled) in FIG. 13. In the expression for the shot noise of an APD, Eq. (1), the excess noise factor is multiplied by the square of the gain. It follows that small changes in the excess noise factor can result in significantly higher noise. In addition to low noise, lower k values are linked to high gain-bandwidth product. The gain-bandwidth product results from the time required for the avalanche process to build up and decay; the higher the gain, the higher the associated time constant and, thus, the lower the bandwidth. Emmons has shown that the frequency-dependent gain can be approximated by the expression $$M(f) = \frac{M_0}{\sqrt{1 + (2\pi f M_0 k\tau)^2}} \quad (3)$$

where $M_0$ is the dc gain and τ is approximately (within a factor of ~2) the carrier transit time across the multiplication region. It follows from this expression that for $M_o>1/k$ the frequency response is characterized by a constant gain bandwidth-product that increases as k decreases. Given the measured k values of the $Al_{0.7}In_{0.3}As_{0.3}Sb_{0.7}$ APDs reported in this work, gain-bandwidth products comparable to those of Si, which have been reported to be as high as 340 GHz, shall be realized.

CONCLUSION

An aspect of an embodiment of the present invention provides, among other things, an avalanche photodiode, fabricated from $Al_{0.7}In_{0.3}As_{0.3}Sb_{0.7}$, with low excess noise corresponding to k=0.015 and peak quantum efficiency of 68% at 735 nm. Furthermore, since $Al_{0.7}In_{0.3}As_{0.3}Sb_{0.7}$ has a direct bandgap, it has the potential for higher bandwidths than Si, which is typically limited by transit times. The new materials system promises an innovative alternative to Si for detection across the visible and near-infrared wavelengths.

ADDITIONAL EXAMPLES

Example 1

An avalanche photodiode that may comprise: a first contact layer; a multiplication layer adjacent to said first contact layer, wherein said multiplication layer comprises AlInAsSb; a charge layer adjacent to the multiplication layer opposite said first contact layer, wherein said charge layer comprises AlInAsSb; an absorption layer adjacent to said charge layer, opposite said multiplication layer, wherein said absorption layer comprises AlInAsSb; a blocking layer adjacent to said absorption layer, opposite said charge layer; and second contact layer adjacent said blocking layer, opposite said absorption layer.

Example 2

The avalanche photodiode according to example 1, wherein said blocking layer comprises AlInASb.

Example 3

The avalanche photodiode according to example 2, wherein said blocking layer comprises $Al_xIn_{1-x}As_ySb_{1-y}$ with x=0.5 to 0.9.

Example 4

The avalanche photodiode according to example 1 (as well as subject matter of one or more of any combination of examples 2-3, in whole or in part), wherein said AlInAsSb absorption layer has a composition $Al_xIn_{1-x}As_ySb_{1-y}$ with x=0.1 to x=0.6.

Example 5

The avalanche photodiode according to example 4 (as well as subject matter of one or more of any combination of examples 2-3, in whole or in part), wherein a thickness of said AlInAsSb absorption layer is approximately 100 nanometers to approximately 4,000 nanometers.

Example 6

The avalanche photodiode according to example 1 (as well as subject matter of one or more of any combination of examples 2-5, in whole or in part), wherein said AlInAsSb charge layer has a composition $Al_xIn_{1-x}As_ySb_{1-y}$ with x=0.5 to 0.9.

Example 7

The avalanche photodiode according to example 1 (as well as subject matter of one or more of any combination of examples 2-6, in whole or in part), wherein said AlInAsSb multiplication layer has a composition $Al_xIn_{1-x}As_ySb_{1-y}$ with x=0.9 to 0.5.

Example 8

The avalanche photodiode according to example 7 (as well as subject matter of one or more of any combination of examples 2-6, in whole or in part), wherein a thickness of said multiplication layer is approximately 100 nanometers to approximately 2,000 nanometers.

Example 9

The avalanche photodiode according to example 1 (as well as subject matter of one or more of any combination of examples 2-8, in whole or in part), further comprising:
a substrate layer positioned adjacent to said multiplication layer, opposite said charge layer.

Example 10

The avalanche photodiode according to example 1 (as well as subject matter of one or more of any combination of examples 2-9, in whole or in part), wherein said substrate layer comprises InP.

Example 11

The avalanche photodiode according to example 1 (as well as subject matter of one or more of any combination of examples 2-10, in whole or in part), wherein said substrate layer comprises GaSb.

Example 12

The avalanche photodiode according to anyone of examples 3, 4, 6, or 7, wherein said $As_ySb_{1-y}$ has a composition represented with y=x.

Example 13

The avalanche photodiode according to example 9 (as well as subject matter of one or more of any combination of examples 2-8 and 10-12, in whole or in part), further comprising at least one contact in electrical communication respectively with said second contact layer and said substrate.

Example 14

The avalanche photodiode according to example 1 (as well as subject matter of one or more of any combination of examples 2-13, in whole or in part), further comprising:
a first graded bandgap layer and second graded bandgap layer adjacent to opposite sides of said AlInAsSb absorption layer, wherein
said first graded bandgap layer is between said AlInAsSb absorption layer and said AlInAsSb charge layer, and
said second graded bandgap layer is between said AlInAsSb absorption layer and said blocking layer.

Example 15

The avalanche photodiode according to example 14 (as well as subject matter of one or more of any combination of examples 2-13, in whole or in part) wherein said first graded bandgap layer comprises $Al_xIn_{1-x}As_ySb_{1-y}$.

16

The avalanche photodiode according to example 15 (as well as subject matter of one or more of any combination of examples 2-14, in whole or in part), wherein:
said AlInAsSb absorption layer has a composition $Al_xIn_{1-x}As_ySb_{1-y}$;
said multiplication layer has a composition $Al_xIn_{1-x}As_ySb_{1-y}$; and
said $Al_x$ composition of said first graded bandgap layer is graded wherein x is between x of said $Al_xIn_{1-x}As_ySb_{1-y}$ multiplication layer to x of said $Al_xIn_{1-x}As_ySb_{1-y}$ absorption layer.

Example 17

The avalanche photodiode according to example 15 (as well as subject matter of one or more of any combination of examples 2-14 and 16, in whole or in part), further comprising:
a substrate layer positioned adjacent to said multiplication layer, opposite said charge layer, wherein said substrate comprises GaSb or InP, and
wherein the composition of said first graded bandgap is graded from the composition of said multiplication layer to that of said absorption layer, wherein said first graded bandgap is lattice matched to either said GaSb or InP substrate.

Example 18

The avalanche photodiode according to example 15 (as well as subject matter of one or more of any combination of examples 2-14 and 16-17, in whole or in part), further comprising:
a substrate layer positioned adjacent to said multiplication layer, opposite said charge layer, wherein said substrate comprises GaSb or InP, and
wherein the $Al_xIn_{1-x}As_ySb_{1-y}$ composition of said first graded bandgap is graded between lattice matched to said GaSb substrate or said InP substrate.

Example 19

The avalanche photodiode according to example 14 (as well as subject matter of one or more of any combination of examples 2-13 and 15-18, in whole or in part), wherein said second graded bandgap layer comprises $Al_xIn_{1-x}As_ySb_{1-y}$.

Example 20

The avalanche photodiode according to example 19 (as well as subject matter of one or more of any combination of examples 2-18, in whole or in part), wherein:
said AlInAsSb absorption layer has a composition $Al_xIn_{1-x}As_ySb_{1-y}$;
said blocking layer has a composition $Al_xIn_{1-x}As_ySb_{1-y}$; and
the $Al_x$ composition of said second graded bandgap layer is graded wherein x is of said $Al_xIn_{1-x}As_ySb_{1-y}$; blocking layer to x of said $Al_xIn_{1-x}As_ySb_{1-y}$ absorption layer.

Example 21

The avalanche photodiode according to example 19 (as well as subject matter of one or more of any combination of examples 2-18 and 20, in whole or in part), further comprising:
a substrate layer positioned adjacent to said multiplication layer, opposite said charge layer, wherein said substrate comprises GaSb or InP, and
wherein the composition of said second graded bandgap is graded from the composition of said blocking layer to that of said absorption layer, wherein said second graded bandgap is lattice matched to either said GaSb or InP substrate.

Example 22

The avalanche photodiode according to example 19 (as well as subject matter of one or more of any combination of examples 2-18 and 20-21, in whole or in part), further comprising:
a substrate layer positioned adjacent to said multiplication layer, opposite said charge layer, wherein said substrate comprises GaSb or InP, and
wherein the $Al_xIn_{1-x}As_ySb_{1-y}$ composition of said second graded bandgap is graded between lattice matched to said GaSb substrate or said InP substrate.

Example 23

The avalanche photodiode according to example 1 (as well as subject matter of one or more of any combination of examples 2-22, in whole or in part), wherein said first contact layer comprise comprises GaSb or InP.

Example 24

The avalanche photodiode according to example 1 (as well as subject matter of one or more of any combination of examples 2-23, in whole or in part), wherein said second contact layer comprise comprises GaSb or InP.

Example 25

The method of using any one or more of the avalanche photodiodes or their components or sub-components provided in any one or more of examples 1-24.

Example 26

The method of manufacturing any one or more of the avalanche photodiodes or their components or sub-components provided in any one or more of examples 1-24.

REFERENCES

The devices, systems, apparatuses, materials, compositions, components, computer readable medium, algorithms, and methods (of manufacture and use) of various embodiments of the invention disclosed herein may utilize aspects disclosed in the following references, applications, publications and patents and which are hereby incorporated by reference herein in their entirety (and which are not admitted to be prior art with respect to the present invention by inclusion in this section):

1. U.S. Patent Application Publication No. US 2003/0047752 A1, Campbell, J., et al., "Avalanche Photodiodes with an Impact-Ionization-Engineered Multiplication Region", Mar. 13, 2003.
2. U.S. Pat. No. 7,045,833 B2, Campbell, J., et al., "Avalanche Photodiodes with an Impact-Ionization-Engineered Multiplication Region", May 16, 2006.
3. U.S. Pat. No. 4,751,555, Alferness, R., et al., "Semiconductor Heterointerface Optical Waveguide", Jun. 14, 1988.
4. U.S. Pat. No. 4,857,982, Forrest, S., "Avalanche Photodiode with Floating Guard Ring", Aug. 15, 1989.
5. U.S. Pat. No. 4,876,209, Forrest, S., "Method of Making Avalanche Photodiode", Oct. 24, 1989.
6. U.S. Pat. No. 5,121,181, Smith, III, T., et al., "Resonant Tunneling Photodetector for Long Wavelength Applications", Jun. 9, 1992.
7. UK Patent Serial No. GB 2273771 B, Nigel Paul Fox., "Detector for Infrared Radiation", Oct. 18, 1995.
8. U.S. Pat. No. 5,596,211, Onda, K., et al., "Field Effect Transistor Having a Graded Bandgap INGAAS_Channel Formed of a Two-Dimensional Electron Gas", Jan. 21, 1997.
9. U.S. Pat. No. 7,276,770 B1, Goushcha, A., et al., "Fast SI Diodes and Arrays with High Quantum Efficiency Built on Dielectrically Isolated Wafers", Oct. 2, 2007.
10. U.S. Patent Application Publication No. US 2010/0133637 A1, Yagyu, E., et al., "Avalanche Photodiode", Jun. 3, 2010.
11. U.S. Pat. No. 5,985,689, Gofuku, I., et al., "Method of Fabricating Photoelectric Conversion Device Having at Least One Step-Back Layer", Nov. 16, 1999.
12. U.S. Pat. No. 6,252,287 B1, Kurtz, S., et al., "INGAASN/GAAS Heterojunction for Multi-Junction Solar Cells", Jun. 26, 2001.
13. U.S. Patent Application Publication No. US 2015/0115319 A1, Levine, B., "Planar Avalanche Photodiode", Apr. 30, 2015.
14. U.S. Patent Application Publication No. US 2014/0291682 A1, Huang, M., et al., "High Performance GESI Avalanche Photodiode Operating Beyond GE Bandgap Limits", Oct. 2, 2014.
15. U.S. Pat. No. 5,539,221, Tsuji, M., et al., "Staircase Avalanche Diode", Jul. 23, 1996.
16. U.S. Pat. No. 5,783,838, Kyozuka, S., et al., "Non-Single Crystalline Semiconductor Photo Detector with Super Lattice", Jul. 21, 1998.
17. U.S. Patent Application Publication No. US 2005/0019541 A1, Ko, C., "Charge Controlled Avalanche Photodiode and Method of Making the Same", Feb. 10, 2005.

18. U.S. Pat. No. 7,161,170 B1, Yoder, P., "Doped-Absorber Graded Transition Enhanced Multiplication Avalanche Photodetector", Jan. 9, 2007.
19. U.S. Pat. No. 6,963,089 B2, Shi, J., et al., "Avalanche Photo-Detector with High Saturation Power and High Gain-Bandwidth Product", Nov. 8, 2005.
20. U.S. Patent Application Publication No. US 2010/0163925 A1, Ishibashi, T., et al., "Avalanche Photodiode", Jul. 1, 2010.
21. U.S. Pat. No. 7,880,197 B2, Ishibashi, T., et al., "Avalanche Photodiode Having Doping Region with Monotonically Increasing Concentration Distribution", Feb. 1, 2011.
22. Ren, M., et al., "AlIAsSb Separate Absorption, Charge, and Multiplication Avalanche Photodiodes, Applied Physics Letters, 108, 191108 (2016), pages 1-4.
22. Campbell, Joe C., "Recent Advances in Avalanche Photodiodes", Journal of Lightwave Technology, Vol. 34, No. 2, Jan. 15, 2016, pages 278-285.
24. Beling, A., et al., "Advances in Photodetectors and Optical Receivers", Optical Fiber Telecommunications, 2013, 6$^{th}$ Edition, Chapter 3, pages 99-154.
25. U.S. Patent Application Publication No. US 2012/0299141 A1, Sasahata, Y., et al., "Avalanche Photodiode and Avalanche Photodiode Array", Nov. 29, 2012.
26. S. R. Forrest, et al., "Long Wavelength Avalanche Photodetector", U.S. Pat. No. 4,473,835 A (25 Sep. 1984).
27. J. C. Campbell and A. G. Dental, "Long Wavelength Avalanche Photodetector", U.S. Pat. No. 4,631,566 A (23 Dec. 1986).
28. J. C. Dries, et al., "Strain Compensated Indium Galium Arsenide Quantum Well Photoconductors with High Indium Content Extended Wavelength Operation", U.S. Pat. No. 6,229,152 B1 (8 May 2001).
29. H. D. Law, et al., "1.0-1.4-$\mu$m High Speed Avalanche Photodiodes", Applied Physics Letters 33, 416 (1978).
30. H. Law, et al., "III-V Alloy Heterostructure High Speed Avalanche Photodiodes", IEEE Journal of Quantum Electronics 15, 549 (1979).
31. Y. Matsushima, et al., 'High Speed-Response InGaAs/InP Heterostructure Avalanche Photodiode with InGaAsP Buffer Layers", Electronics Letters 18, 945 (1982).
32. J. C. Campbell, et al., "High-Speed Avalanche Photodiode with Separate Absorption 'Grading' and Multiplication Regions", Electronics Letters 19, 818 (1983).
33. Y. Hirota, et al., Japanese Journal of Applied Physics 43, L375 (2004). Y. Kang, et al., Nat Photon 3, 59 (2009).
34. Kang, Y., et al., "Monolithic germanium/silicon avalanche photodiodes with 340 GHz gain-bandwidth product", Nature Photonics, Vol. 3, January 2009, pgs. 59-63.
35. M. Woodson, et al., "Low-noise AlInAsSb Avalanche Photodiode", Applied Physics Letters 108, 081102 (2016), pgs. 1-4.
36. J. C. Campbell, "Advances in photodetectors," in Optical Fiber Telecommunications, Vol. 5, Part A: Components and Subsystems, 5th Edition, I. Kaminow, Tingye Li, and A. E. Wilner, editors (Academic Press, 2008).
37. J. C. Campbell, J. Lightwave Tech., 34, no. 2, 278-285 (2016).
38. T. Fujisawa, S. Kanazawa, K. Takahata, W. Kobayashi, T. Tadokoro, H. Ishii, and F. Kano, Opt. Express 20, 614-620 (2012).
39. McIntyre, R. J., IEEE Trans. Electron Dev. ED-13, 164 (1966).
40. R. B. Emmons, J. Appl. Phys. 38, 3705 (1967).
41. C. Y. Park, K. S. Hyun, S. K. Kang, M. K. Song, T. Y. Yoon, H. M. Kim, H. M. Park, S.-C. Park, Y. H. Lee, C. Lee, J. B Yoo, Optical and Quantum Electronics, 2, 5, 553-559 (1995).
42. Ghulam Hasnain, W. G. Bi, S. Song, J. T. Anderson, N. Moll, Chung-Yi Su, J. N. Hollenhorst, N. D. Baynes, I. Athroll, S. Amos, and R. M. Ash, IEEE J. Quantum Elect., vol. 34, no. 12, 2321-2326 (1998).
43. M. A. Itzler, K. K. Loi, S. McCoy, N. Codd and N. Komaba, LEOS '99. IEEE Lasers and Electro-Optics Society 12th Annual Meeting, 2, 748-749, San Francisco, USA (1999).
44. M. Nada, Y. Muramoto, H. Yokoyama, T. Ishibashi, and H. Matsuzaki, J. Lightwave Technol. 32, 1543-1548 (2014)
45. Y. Kang, H.-D. Liu, M. Morse, M. J. Paniccia, M. Zadka, S. Litski, G. Sarid, A. Pauchard, Y.-H. Kuo, H.-W. Chen, W. S. Zaoui, J. E. Bowers, A. Beling, D. C. McIntosh, X. Zheng, and J. C. Campbell, Nat. Photonics 3, 59 (2009).
46. Y. Kang, Z. Huang, Y. Saado, J. Campbell, A. Pauchard, J. Bowers, and M. Paniccia, Optical Fiber Communication Conference/National Fiber Optic Engineers Conference 2011, OWZ1 (2011).
47. N. Duan, T. Liow, A. Lim, L. Ding, and G. Q. Lo, Opt. Express, 20, 11031-11036 (2012).
48. M. Huang, P. Cai, L. Wang, T. Shi, W. Chen, S. Li, G. Hou, C. Hong, and D. Pan, Optical Fiber Communication Conference, Tu2C.2. (2014).
49. L. G. Vaughn, L. R. Dawson, E. A. Pease, L. F. Lester, H. Xu, Y. Jiang, and A. L. Gray, Proc. SPIE 5722, 307-318 (2005).
50. S. J. Maddox and S. R. Bank, "Broadly Tunable AlInAsSb Digital Alloys Grown on GaSb," J. Cryst. Growth Des. (submitted).
51. M. E. Woodson, M. Ren, S. J. Maddox, Y. Chen, S. R. Bank and J. C. Campbell, Appl. Phys. Lett. 108, 081102 (2016). 52. M. Ren, S. J. Maddox, Y. Chen, M. Woodson, J. C. Campbell, and S. R. Bank, Appl. Phys. Lett., 108, 081101 (2016).
53. C. Lenox, P. Yuan, H. Nie, O. Baklenov, C. Hansing, J. C. Campbell, A. L. Holmes, Jr., and B. G. Streetman, Appl. Phys. Lett. 73, 783 (1998).
54. F. Ma, S. Wang, X. Li, K. A. Anselm, X. G. Zheng, A. L. Holmes, and J. C. Campbell, "Monte carlo simulation of low-noise avalanche photodiodes with heterojunctions," J. Appl. Phys., vol. 92, no. 8, pp. 4791-4795, 2002.
55. L. V. Keldysh, "Kinetic theory of impact ionization in semiconductors," Soviet Phys. JETP, vol. 37, no. 10, pp. 509-518, 1960.
56. W. Sun, Z. Lu, X. Zheng, J. C. Campbell, S. J. Maddox, H. P. Nair, and S. R. Bank, IEEE J. Quantum Electron., vol. 49, 2 154 (2013).
57. H. Liu, H. Pan, C. Hu, D. McIntosh, Z. Lu, J. C. Campbell, Y. Kang and M. Morse, J. Appl. Phys. 106, 064507 (2009).
58. P. P. Webb, R. J. McIntyre, and J. Conradi, RCA Review, 35, 2, 234-78, (1974).
59. V. M. Robbins, T. Wang, K. F. Brennan, K. Hess, and G. E. Stillman, Journal of Applied Physics, 58, 4614-4617, (1985).
60. U.S. patent Ser. No. 15/185,914, to Bank et al., "Staircase Avalanche Photodiode with a Staircase Multiplication Region Composed of an AlInAsSb Alloy", Jun. 17, 2016.
61. U.S. Patent Application Publication No. US 2016/0372623 A1, to Bank et al., "Staircase Avalanche Photodiode with a Staircase Multiplication Region Composed of an AlInAsSb Alloy", Dec. 22, 2016.

Unless clearly specified to the contrary, there is no requirement for any particular described or illustrated activity or element, any particular sequence or such activities, any particular size, speed, material, duration, contour, dimension or frequency, or any particularly interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. It should be appreciated that aspects of the present invention may have a variety of sizes, contours, shapes, compositions and materials as desired or required.

In summary, while the present invention has been described with respect to specific embodiments, many modifications, variations, alterations, substitutions, and equivalents will be apparent to those skilled in the art. The present invention is not to be limited in scope by the specific embodiment described herein. Indeed, various modifications of the present invention, in addition to those described herein, will be apparent to those of skill in the art from the foregoing description and accompanying drawings. Accordingly, the invention is to be considered as limited only by the spirit and scope of the following claims, including all modifications and equivalents.

Still other embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application. For example, regardless of the content of any portion (e.g., title, field, background, summary, abstract, drawing figure, etc.) of this application, unless clearly specified to the contrary, there is no requirement for the inclusion in any claim herein or of any application claiming priority hereto of any particular described or illustrated activity or element, any particular sequence of such activities, or any particular interrelationship of such elements. Moreover, any activity can be repeated, any activity can be performed by multiple entities, and/or any element can be duplicated. Further, any activity or element can be excluded, the sequence of activities can vary, and/or the interrelationship of elements can vary. Unless clearly specified to the contrary, there is no requirement for any particular described or illustrated activity or element, any particular sequence or such activities, any particular size, speed, material, dimension or frequency, or any particularly interrelationship of such elements. Accordingly, the descriptions and drawings are to be regarded as illustrative in nature, and not as restrictive. Moreover, when any number or range is described herein, unless clearly stated otherwise, that number or range is approximate. When any range is described herein, unless clearly stated otherwise, that range includes all values therein and all sub ranges therein. Any information in any material (e.g., a United States/foreign patent, United States/foreign patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

We claim:

1. An avalanche photodiode comprising:
   a first contact layer;
   a multiplication layer adjacent to said first contact layer, wherein said multiplication layer comprises AlInAsSb;
   a charge layer adjacent to the multiplication layer opposite said first contact layer, wherein said charge layer comprises AlInAsSb;
   an absorption layer adjacent to said charge layer, opposite said multiplication layer, wherein said absorption layer comprises AlInAsSb;
   a blocking layer adjacent to said absorption layer, opposite said charge layer; and
   second contact layer adjacent said blocking layer, opposite said absorption layer.

2. The avalanche photodiode according to claim 1, wherein said blocking layer comprises AlInAsSb.

3. The avalanche photodiode according to claim 2, wherein said blocking layer comprises $Al_xIn_{1-x}As_ySb_{1-y}$ with x=0.5 to 0.9.

4. The avalanche photodiode according to claim 1, wherein said AlInAsSb absorption layer has a composition $Al_xIn_{1-x}As_ySb_{1-y}$ with x=0.1 to x=0.6.

5. The avalanche photodiode according to claim 4, wherein a thickness of said AlInAsSb absorption layer is approximately 100 nanometers to approximately 4,000 nanometers.

6. The avalanche photodiode according to claim 1, wherein said AlInAsSb charge layer has a composition $Al_xIn_{1-x}As_ySb_{1-y}$ with x=0.5 to 0.9.

7. The avalanche photodiode according to claim 1, wherein said AlInAsSb multiplication layer has a composition $Al_xIn_{1-x}As_ySb_{1-y}$ with x=0.9 to 0.5.

8. The avalanche photodiode according to claim 7, wherein a thickness of said multiplication layer is approximately 100 nanometers to approximately 2,000 nanometers.

9. The avalanche photodiode according to any one of claim 3, 4, 6, or 7, wherein said $Al_xIn_{1-x}As_ySb_{1-y}$ has a composition represented with y=x.

10. The avalanche photodiode according to claim 1, further comprising:
    a substrate layer positioned adjacent to said multiplication layer, opposite said charge layer.

11. The avalanche photodiode according to claim 10, further comprising at least one contact in electrical communication respectively with said second contact layer and said substrate.

12. The avalanche photodiode according to claim 1, wherein said substrate layer comprises InP.

13. The avalanche photodiode according to claim 1, wherein said substrate layer comprises GaSb.

14. The avalanche photodiode according to claim 1, further comprising:
    a first graded bandgap layer and second graded bandgap layer adjacent to opposite sides of said AlInAsSb absorption layer, wherein
    said first graded bandgap layer is between said AlInAsSb absorption layer and said AlInAsSb charge layer, and
    said second graded bandgap layer is between said AlInAsSb absorption layer and said blocking layer.

15. The avalanche photodiode according to claim 14, wherein said first graded bandgap layer comprises $Al_xIn_{1-x}As_ySb_{1-y}$.

16. The avalanche photodiode according to claim 15, wherein:
- said AlInAsSb absorption layer has a composition $Al_xIn_{1-x}As_ySb_{1-y}$;
- said multiplication layer has a composition $Al_xIn_{1-x}As_ySb_{1-y}$; and
- said $Al_x$ composition of said first graded bandgap layer is graded wherein x is between x of said $Al_xIn_{1-x}As_ySb_{1-y}$ multiplication layer to x of said $Al_xIn_{1-x}As_ySb_{1-y}$ absorption layer.

17. The avalanche photodiode according to claim 15, further comprising:
- a substrate layer positioned adjacent to said multiplication layer, opposite said charge layer, wherein said substrate comprises GaSb or InP, and
- wherein the composition of said first graded bandgap is graded from the composition of said multiplication layer to that of said absorption layer, wherein said first graded bandgap is lattice matched to either said GaSb or InP substrate.

18. The avalanche photodiode according to claim 15, further comprising:
- a substrate layer positioned adjacent to said multiplication layer, opposite said charge layer, wherein said substrate comprises GaSb or InP, and
- wherein the $Al_xIn_{1-x}As_ySb_{1-y}$ composition of said first graded bandgap is graded between lattice matched to said GaSb substrate or said InP substrate.

19. The avalanche photodiode according to claim 14, wherein said second graded bandgap layer comprises $Al_xIn_{1-x}As_ySb_{1-y}$.

20. The avalanche photodiode according to claim 19, wherein:
- said AlInAsSb absorption layer has a composition $Al_xIn_{1-x}As_ySb_{1-y}$;
- said blocking layer has a composition $Al_xIn_{1-x}As_ySb_{1-y}$; and
- the $Al_x$ composition of said second graded bandgap layer is graded wherein x is of said $Al_xIn_{1-x}As_ySb_{1-y}$ blocking layer to x of said $Al_xIn_{1-x}As_ySb_{1-y}$ absorption layer.

21. The avalanche photodiode according to claim 19, further comprising:
- a substrate layer positioned adjacent to said multiplication layer, opposite said charge layer, wherein said substrate comprises GaSb or InP, and
- wherein the composition of said second graded bandgap is graded from the composition of said blocking layer to that of said absorption layer, wherein said second graded bandgap is lattice matched to either said GaSb or InP substrate.

22. The avalanche photodiode according to claim 19, further comprising:
- a substrate layer positioned adjacent to said multiplication layer, opposite said charge layer, wherein said substrate comprises GaSb or InP, and
- wherein the $Al_xIn_{1-x}As_ySb_{1-y}$ composition of said second graded bandgap is graded between lattice matched to said GaSb substrate or said InP substrate.

23. The avalanche photodiode according to claim 1, wherein said first contact layer comprise comprises GaSb or InP.

24. The avalanche photodiode according to claim 1, wherein said second contact layer comprise comprises GaSb or InP.

* * * * *